（12）United States Patent
Kawakubo et al.

(10) Patent No.: US 7,550,904 B2
(45) Date of Patent: Jun. 23, 2009

(54) THIN-FILM PIEZOELECTRIC RESONATOR AND FILTER CIRCUIT

(75) Inventors: Takashi Kawakubo, Yokohama (JP); Toshihiko Nagano, Kawasaki (JP); Michihiko Nishigaki, Kawasaki (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 11/646,684

(22) Filed: Dec. 28, 2006

(65) Prior Publication Data

US 2007/0252485 A1 Nov. 1, 2007

(30) Foreign Application Priority Data

Dec. 28, 2005 (JP) ............................. 2005-379490

(51) Int. Cl.
*H01L 41/047* (2006.01)
*H01L 41/053* (2006.01)

(52) U.S. Cl. .................. 310/365; 310/349; 310/351; 310/366; 310/369

(58) Field of Classification Search ............. 310/313 R, 310/349, 351, 352, 365, 366, 369
See application file for complete search history.

(56) References Cited

U.S. PATENT DOCUMENTS 3,114,849 A * 12/1963 Poschenrieder ............. 310/330
3,453,458 A * 7/1969 Smith et al. ................. 310/344
4,453,242 A * 6/1984 Toda ........................... 369/132
5,552,655 A * 9/1996 Stokes et al. ................ 310/330
6,323,580 B1 * 11/2001 Bernstein .................... 310/324
6,813,928 B2 * 11/2004 Blakley ...................... 73/19.03
2003/0173873 A1 * 9/2003 Bryant et al. ............... 310/365

FOREIGN PATENT DOCUMENTS

JP 07-147526 6/1995

OTHER PUBLICATIONS

Piazza et al.; "Single-Chip Multiple-Frequency Filters Based on Contour-Mode Aluminum Nitride Piezoelectric Micromechanical Resonators"; The 13th International Conference Solid-State Sensors, Actuators and Microsystems, Seoul, Korea.; Jun. 5-9, 2005; pp. 2065-2068.

* cited by examiner

*Primary Examiner*—Thomas M Dougherty
(74) *Attorney, Agent, or Firm*—Ohlandt, Greeley, Ruggiero & Perle, L.L.P.

(57) ABSTRACT

A thin-film piezoelectric resonator has a piezoelectric film which is formed via a space on a substrate and is supported on the substrate at least one location, an upper electrode which has a plurality of electrode layers and a connection part connecting the electrode layers to each other, each of the electrode layers being formed on the piezoelectric film, having the same width and being arranged at the same interval as the width, a lower electrode formed under the piezoelectric film, a first pad which is formed on the substrate and is electrically connected to the upper electrode, and a second pad which is formed on the substrate and is electrically connected to the lower electrode.

20 Claims, 16 Drawing Sheets

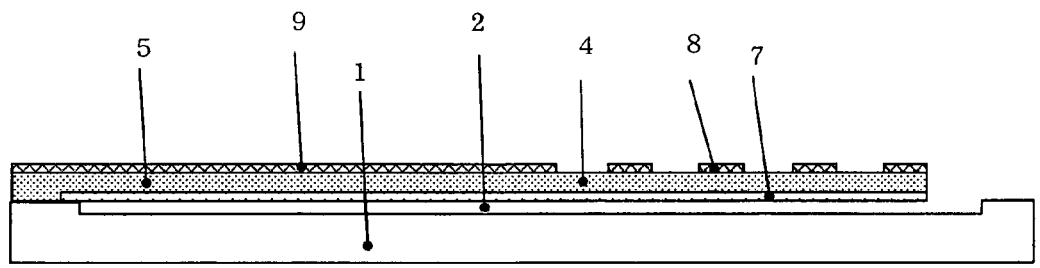
F I G. 2
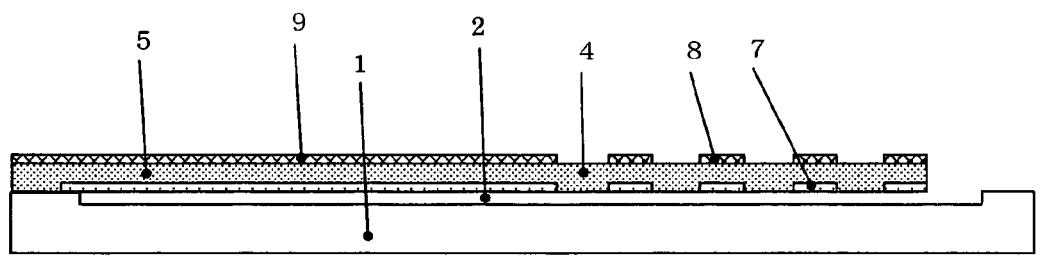
F I G. 3

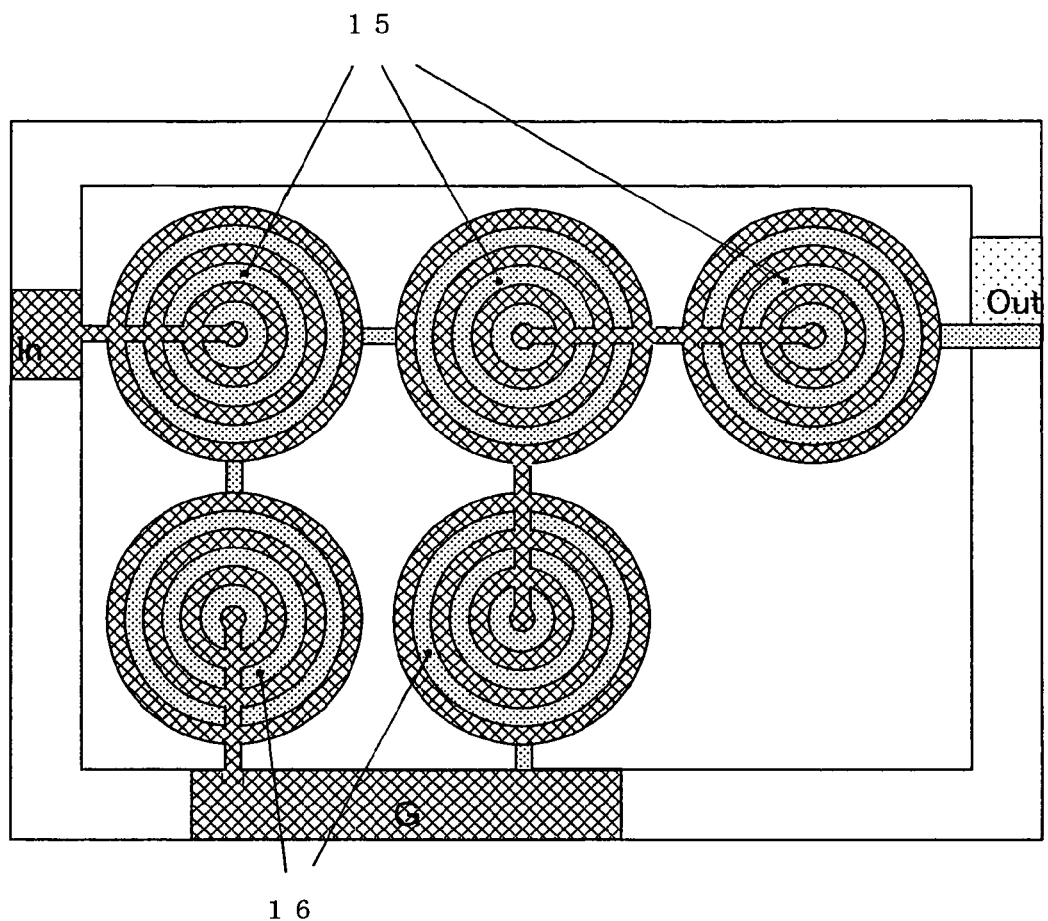
F I G. 4
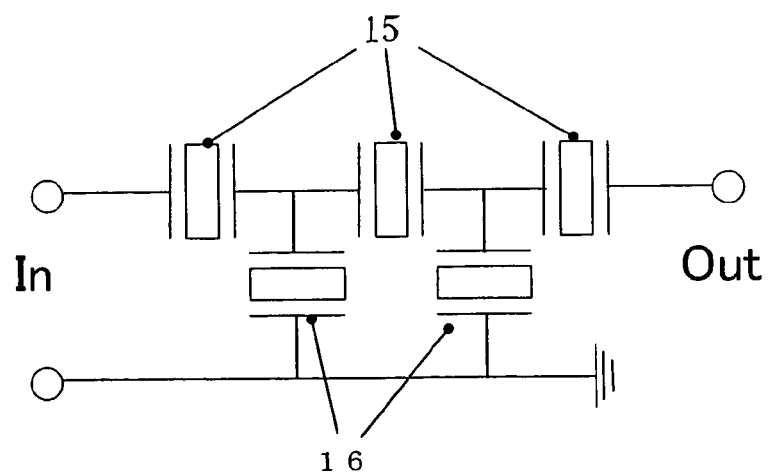
F I G. 5

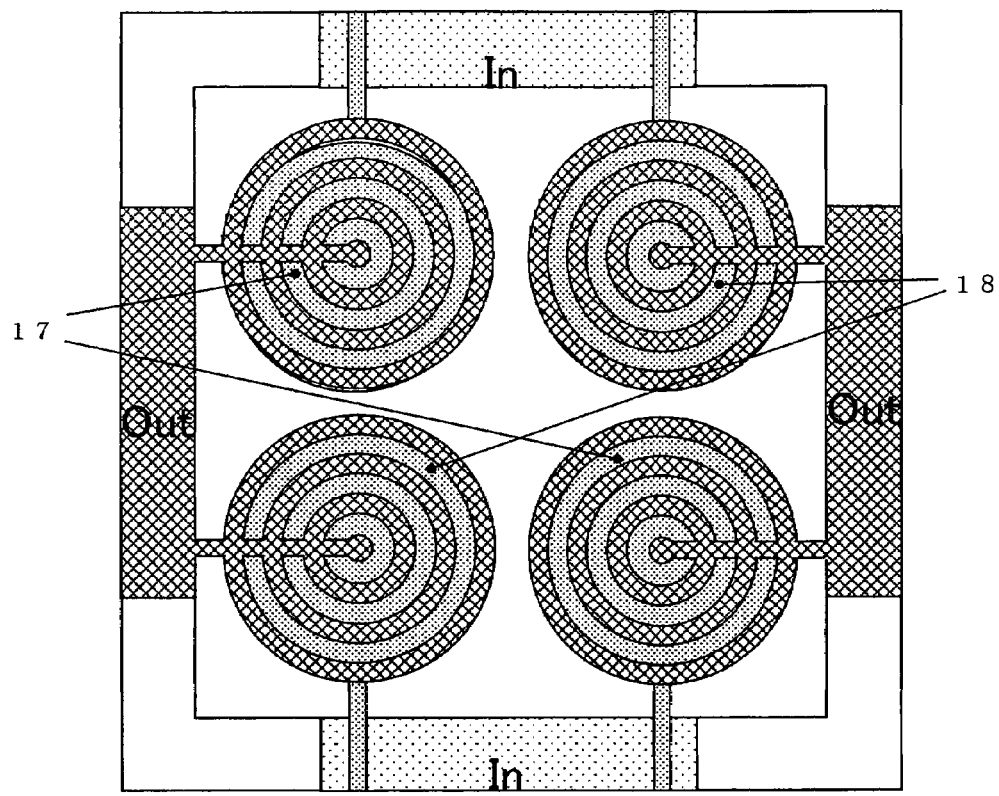
F I G. 6
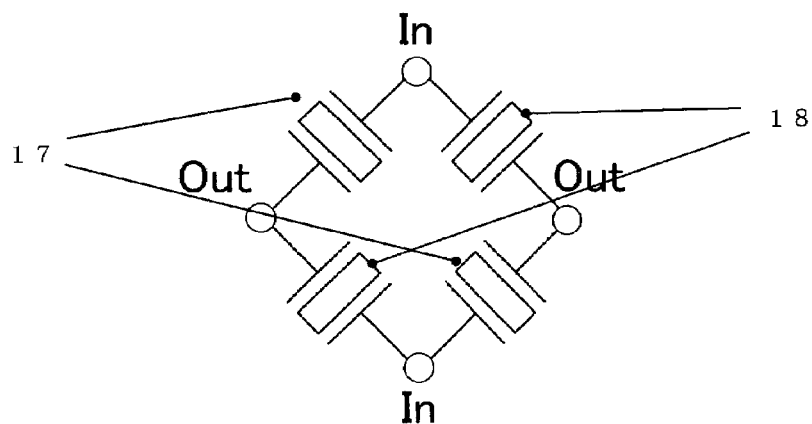
F I G. 7

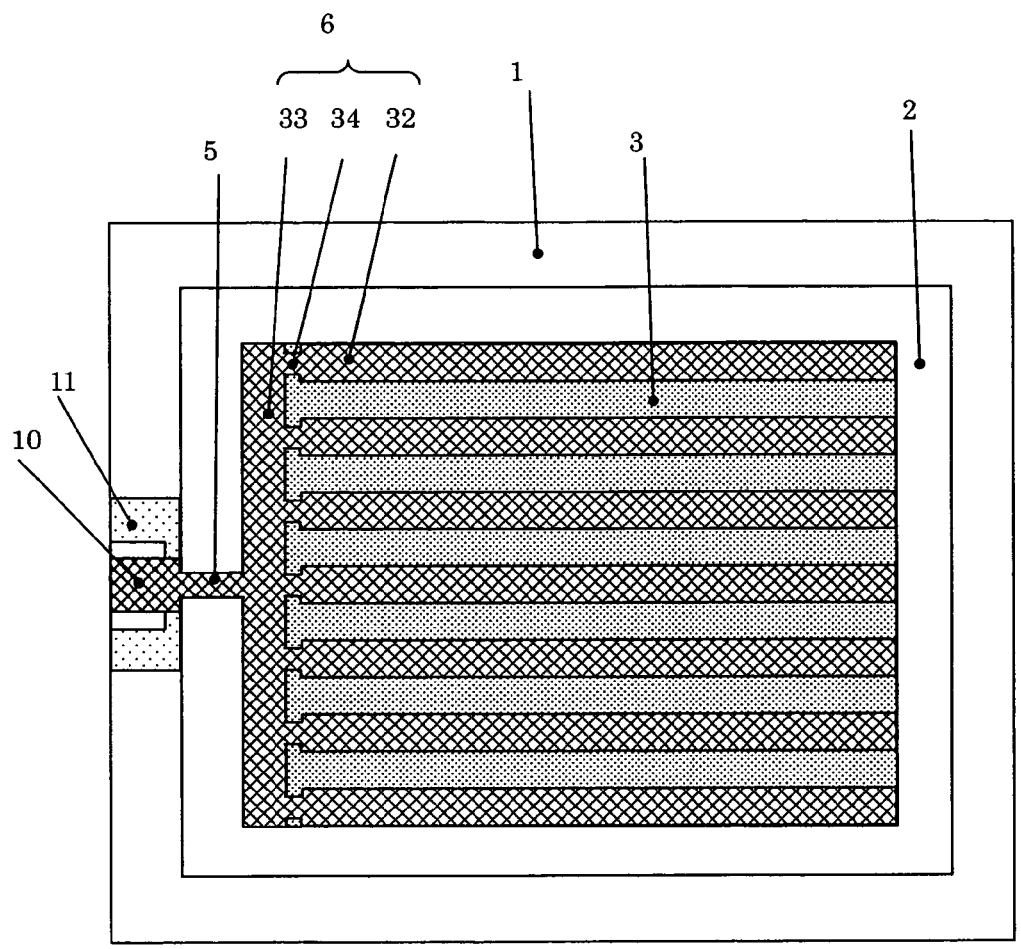
F I G. 11

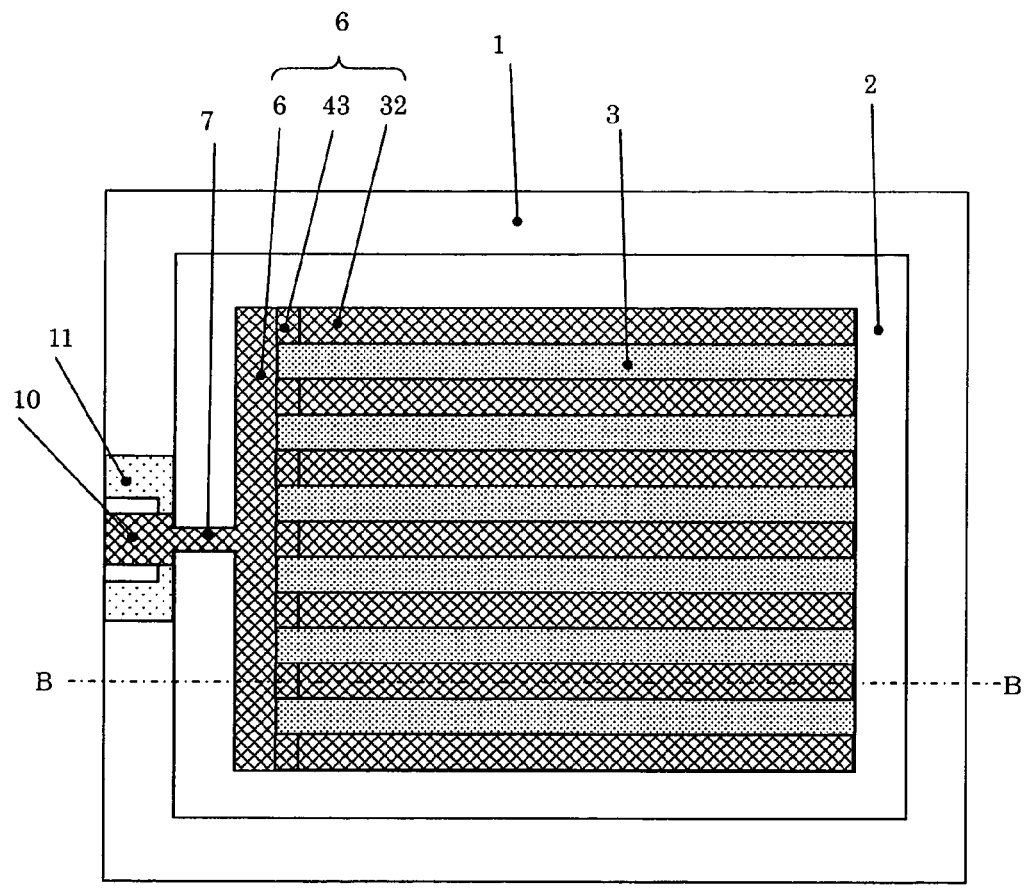
F I G. 12
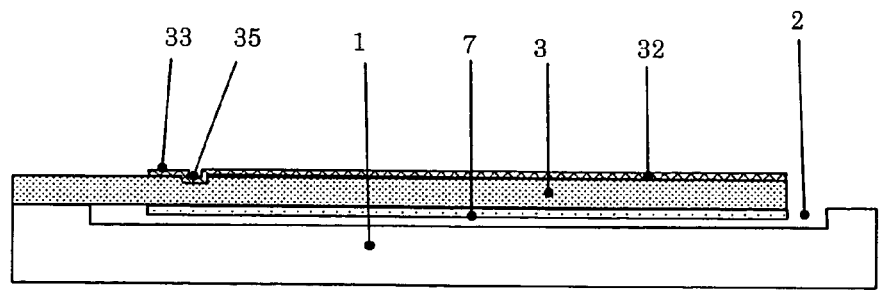
F I G. 13

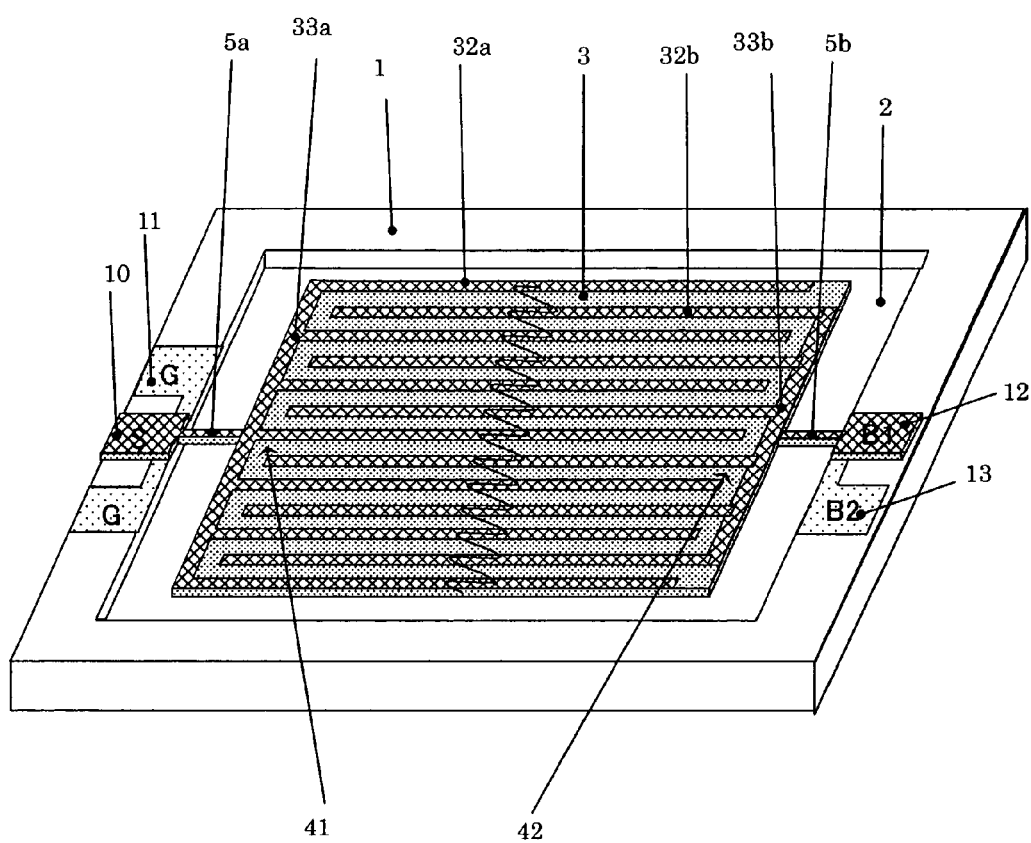
F I G. 14

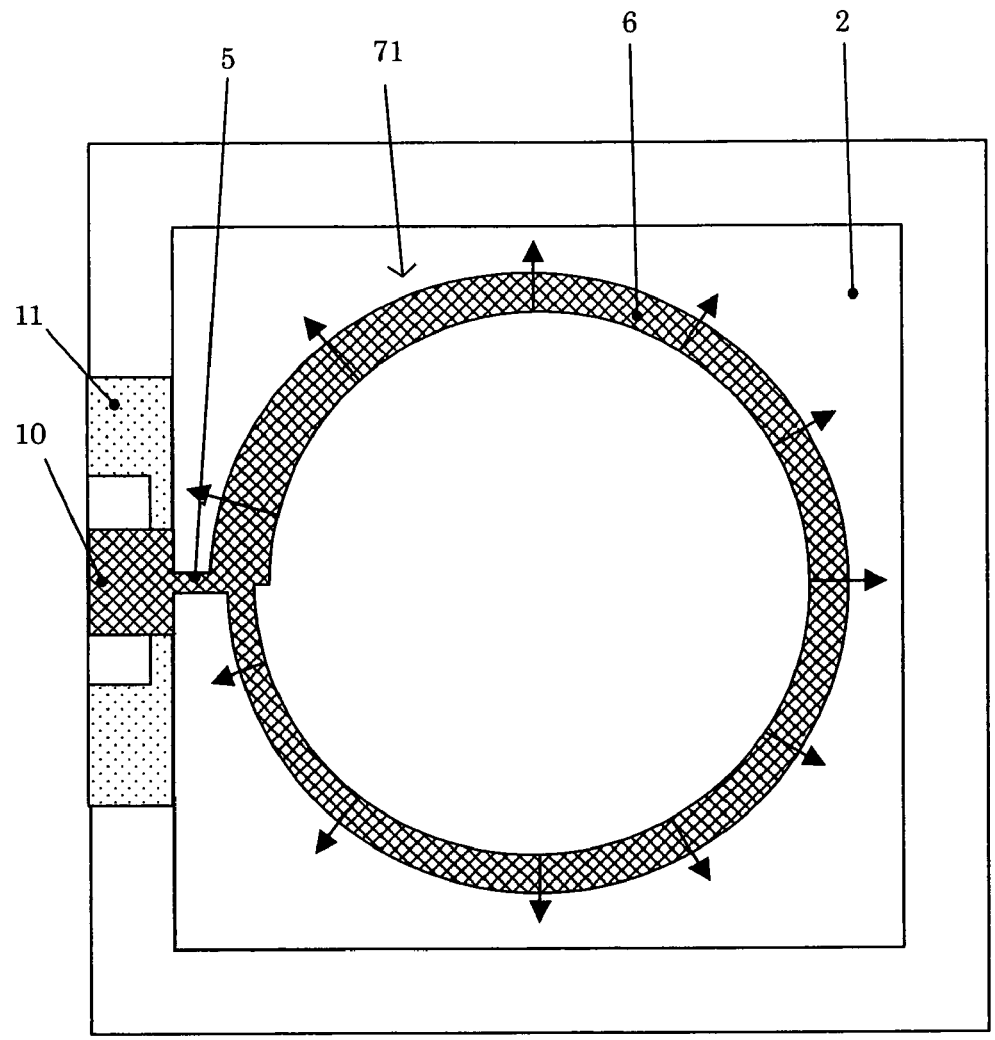
F I G. 17

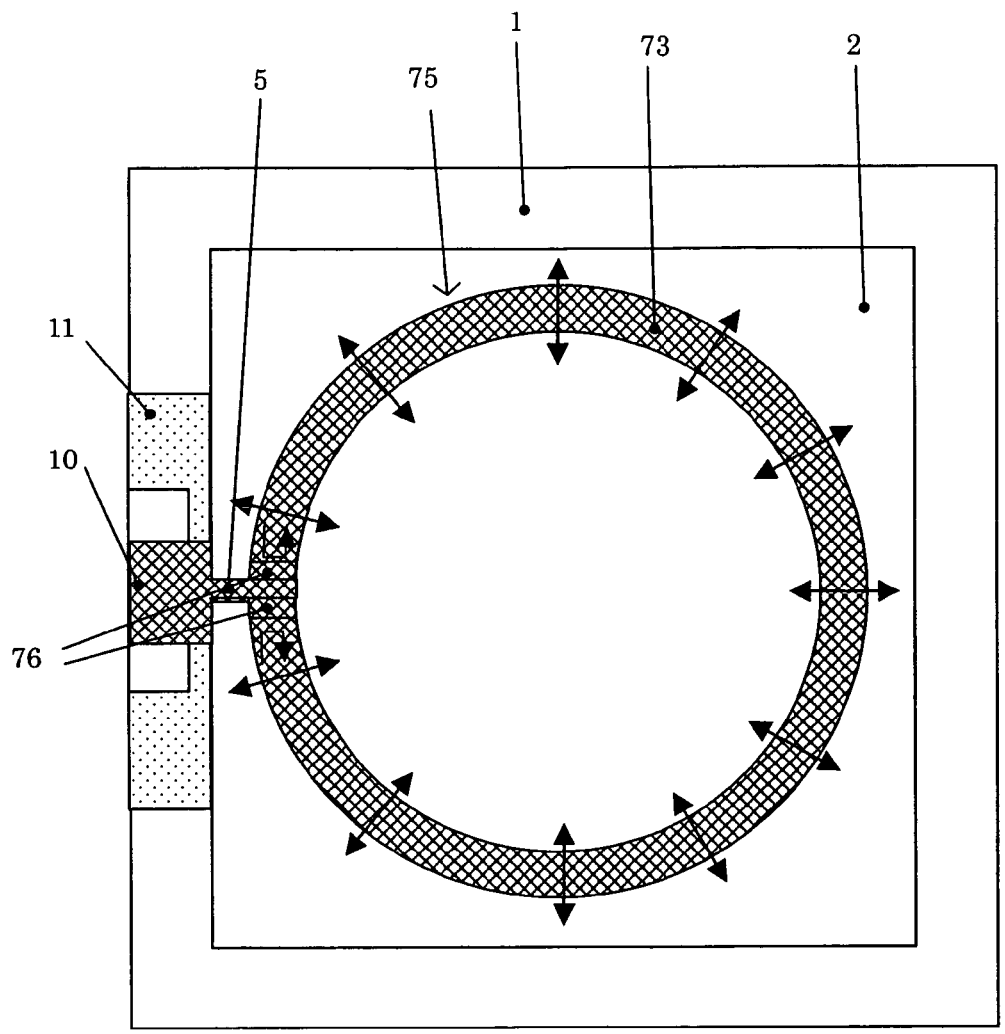
F I G. 19

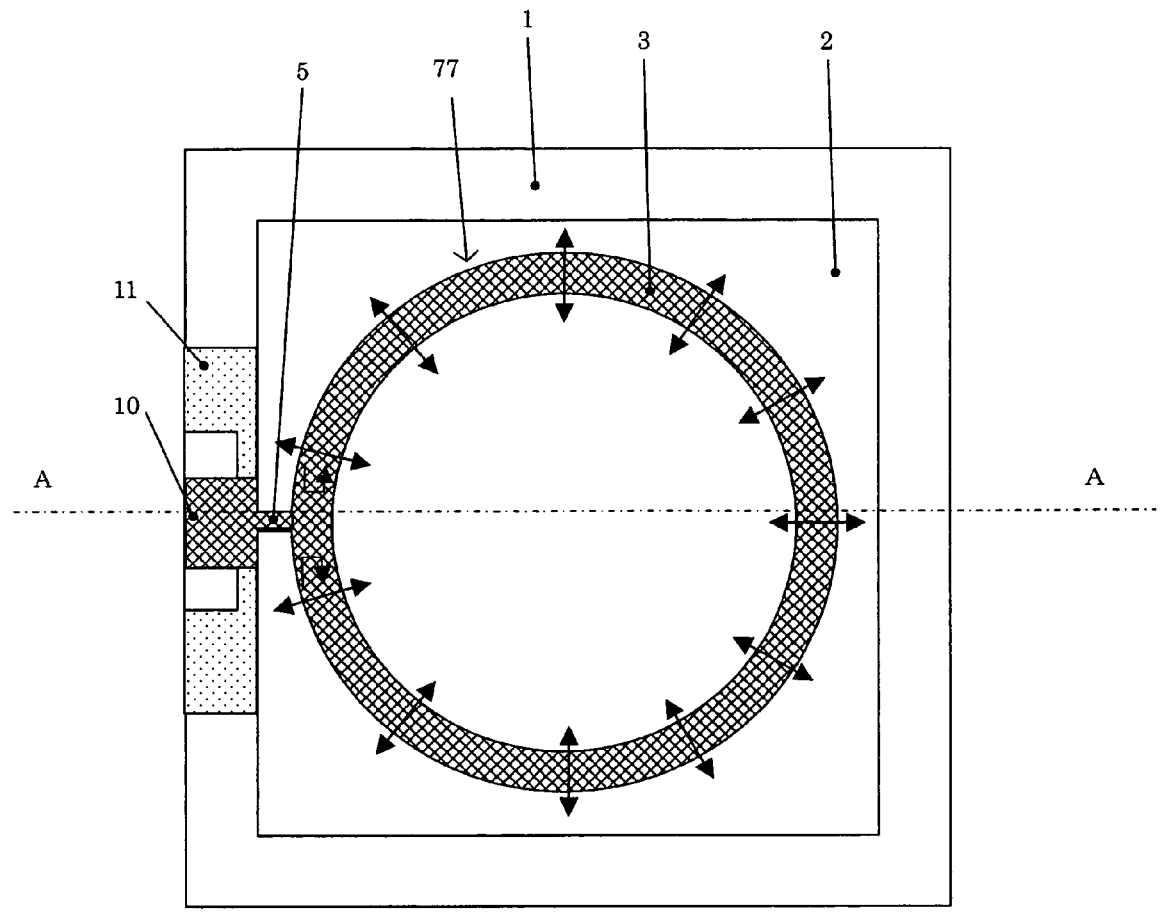
F I G. 20
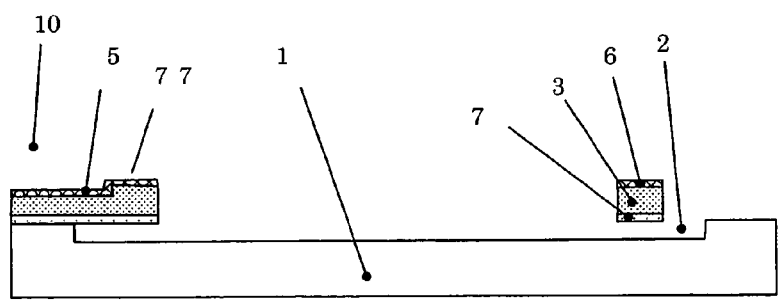
F I G. 21

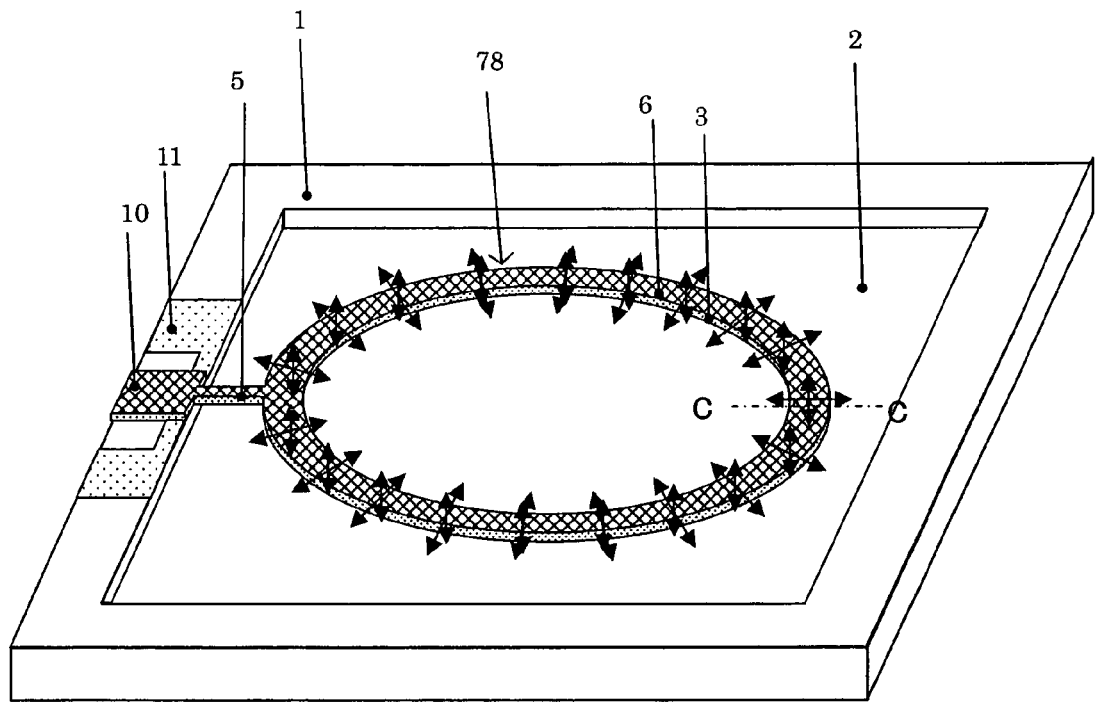
F I G. 22
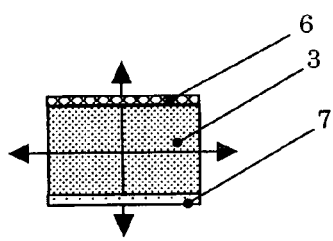
F I G. 23

THIN-FILM PIEZOELECTRIC RESONATOR AND FILTER CIRCUIT

CROSS REFERENCE TO RELATED APPLICATIONS

This application is based upon and claims the benefit of priority from the prior Japanese Patent Application No. 2005-379490, filed on Dec. 28, 2005, the entire contents of which are incorporated herein by reference.

BACKGROUND OF THE INVENTION

1. Field of the Invention

The present invention relates to a thin-film piezoelectric resonator and a filter circuit that use longitudinal resonance in a width direction of a piezoelectric film.

2. Related Art

A surface acoustic wave (SAW) resonator is generally used as radio frequency (RF) and intermediate frequency (IF) filters in a mobile communication apparatus. However, since a resonant frequency of the SAW resonator is inversely proportional to a distance between comb electrodes, the distance between comb electrodes is reduced below 1 μm in a frequency domain exceeding 1 GHz. This imposes manufacturing limitations on increasing the resonant frequency. The SAW resonator, therefore, may not accommodate the increased frequency that is demanded to use in recent years.

Instead of the SAW resonator, a thin-film piezoelectric resonator that uses a thickness longitudinal oscillation mode of a piezoelectric thin film attracts attention. The thin-film piezoelectric resonator is also called as an FBAR (Film Bulk Acoustic Resonator) or a BAW (Bulk Acoustic Wave) element. In the thin-film piezoelectric resonator, a resonant frequency depends on a sound velocity and a film thickness of a piezoelectric body. Usually, a film thickness of 1 to 2 μm corresponds to a frequency of 2 GHz and a film thickness of 0.4 to 0.8 μm corresponds to a frequency of 5 GHz. It is possible to use a frequency as high as several tens GHz.

However, in the FBAR, the resonant frequency depends on thickness of the piezoelectric thin film. Thus, it is difficult to realize, as a single device, a resonator that copes with plural frequencies, that is, a so-called multiband resonator.

Besides, a thin-film piezoelectric resonator that uses a longitudinal resonance mode in a width direction of a piezoelectric thin film has been also proposed (see JP-A 7-147526 (Kokai) and Proceedings of The 13$^{th}$ International Conference on Solid-State Sensors, Actuators and Microsystems, Seoul, Korea, Jun. 5-9, 2005, pp. 2065-2068). This type of thin-film piezoelectric resonator is called as a contour mode acoustic resonator, a Lame mode acoustic resonator, or the like.

In the contour mode acoustic resonator, a resonant frequency depends on a sound velocity of a piezoelectric body and the width of a resonator. Thus, there is an advantage that it is possible to provide a multiband resonator as a single device. However, as in the SAW resonator, since the width of the resonator is inversely proportional to the resonant frequency, it is difficult, for example, to cope with a frequency in a GHz order or higher frequencies.

SUMMARY OF THE INVENTION

The invention provides a thin-film piezoelectric resonator and a filter circuit that are capable of increasing a resonant frequency with a simple structure.

According to one embodiment of the present invention, a thin-film piezoelectric resonator, comprising:

a piezoelectric film which is formed via a space on a substrate and is supported on the substrate at least one location;

an upper electrode which has a plurality of electrode layers and a connection part connecting the electrode layers to each other, each of the electrode layers being formed on the piezoelectric film, having the same width and being arranged at the same interval as the width;

a lower electrode formed under the piezoelectric film;

a first pad which is formed on the substrate and is electrically connected to the upper electrode; and a second pad which is formed on the substrate and is electrically connected to the lower electrode.

According to one embodiment of the present invention, a thin-film piezoelectric resonator, comprising:

first and second resonators formed via a space on a substrate, wherein the first resonator has:

a piezoelectric film supported on the substrate at least one location;

a first upper electrode which has a plurality of first electrode layers and a first connection part connecting the first electrode layers to each other, each of the first electrode layers being formed on the piezoelectric film, having the same width and being arranged at an interval of substantially third multiple of the width;

a lower electrode formed under the piezoelectric film;

a first pad which is formed on the substrate and is electrically connected to the first upper electrode; and a second pad which is formed on the substrate and is electrically connected to the lower electrode, wherein the second resonator has:

a second upper electrode which a plurality of second electrode layers and a second connection part connecting the second electrode layers to each other, each of the second electrode layers being formed on the piezoelectric film, having the same width, being arranged at an interval of substantially third multiple of the width, and being alternately arranged at the same interval in gaps of the plurality of first electrode layers;

a third pad which is formed on the substrate and is electrically connected to the second upper electrode; and a fourth pad which is formed on the substrate and is electrically connected to the lower electrode.

According to one embodiment of the present invention, a thin-film piezoelectric resonator, comprising:

a plurality of annular resonators of concentric shape which are formed via a space on a substrate, have widths different from each other and have diameters different from each other;

a connection part which is formed in a concave part on the substrate and connects the plurality of annular resonators to each other; and a supporting part which connects the annular resonator arranged the most outside to the substrate, wherein each of the plurality of annular resonators, the connection part and the supporting part has:

a piezoelectric film;

an upper electrode formed above the piezoelectric film; and a lower electrode formed under the piezoelectric film.

According to one embodiment of the present invention, a thin-film piezoelectric resonator, comprising:

an annular resonator which is formed via a space on a substrate, is supported on the substrate at least one location and has a width to be continuously changed;

wherein the resonator has:

an annular piezoelectric film;

an upper electrode which is formed on the piezoelectric film and is formed along a width of the piezoelectric film;

a lower electrode formed under the piezoelectric film;

a first pad which is formed on the substrate and is connected to the upper electrode; and a second pad which is formed on the substrate and is connected to the lower electrode.

According to one embodiment of the present invention, a thin-film piezoelectric resonator, comprising:

an annular resonator formed via a space on a substrate;

a supporting part connected between the resonator and the substrate; and first and second pads which are formed on the substrate and supply the resonator with voltages, wherein each of the resonator and the supporting part has:

a piezoelectric film;

an upper electrode formed on the piezoelectric film; and a lower electrode formed on the piezoelectric film, at least one of the resonator and the supporting part having a loss compensation structure which prevents vibration due to resonance generated by the resonator from being transmitted to the supporting part.

According to one embodiment of the present invention, a thin-film piezoelectric resonator, comprising:

an annular resonator formed via a space on a substrate;

a supporting part connected between the resonator and the substrate; and first and second pads which are formed on the substrate and supply the resonator with a voltage, wherein each of the resonator and the supporting part has:

a piezoelectric film;

an upper electrode formed above the piezoelectric film; and a lower electrode formed under the piezoelectric film, a width of the resonator being an integer multiple of a half-wavelength corresponding to a resonant frequency of longitudinal mode resonance in a width direction; and a thickness of the resonator is an integer multiple of a half-wavelength corresponding to the resonant frequency of longitudinal mode resonance in a thickness direction.

According to one embodiment of the present invention, a filer circuit, comprising:

a series resonator which has a plurality of thin-film piezoelectric resonators connected in series between an input terminal and an output terminal; and a parallel resonator which has at least one thin-film piezoelectric resonator connected between a connection node between the plurality of thin-film piezoelectric resonators and a reference voltage terminal, wherein at least one of the thin-film piezoelectric resonator in the series resonator and the parallel resonator has:

a piezoelectric film which is formed via a space on a substrate and is supported on the substrate at least one location;

an upper electrode which has a plurality of electrode layers and a connection part connecting the electrode layers to each other, the electrode layers being formed on the piezoelectric film, having the same width and being arranged at the same interval as the width;

a lower electrode formed under the piezoelectric film;

a first pad which is formed on the substrate and is electrically connected to the upper electrode; and a second pad which is formed on the substrate and is electrically connected to the lower electrode.

a connection part which is formed on the piezoelectric film, has the same width

BRIEF DESCRIPTION OF THE DRAWINGS

FIG. 2 is a cross-sectional view along line A-A in FIG. 1;

FIG. 3 is a cross-sectional view showing an example in which a lower electrode 7 is patterned in the same shape as an upper electrode 6;

FIG. 4 is a plan view showing an example of a ladder-type filter constituted by using the thin-film piezoelectric resonator shown in FIG. 1;

FIG. 5 is a circuit diagram of the filter shown in FIG. 4;

FIG. 6 is a plan view showing an example of a lattice-type high-frequency filter constituted by using the thin-film piezoelectric resonator shown in FIG. 1;

FIG. 7 is a circuit diagram of the filter shown in FIG. 6;

FIG. 11 is a plan view showing a modification of the thin-film piezoelectric resonator shown in FIG. 10;

FIG. 12 is a plan view showing another modification of the thin-film piezoelectric resonator shown in FIG. 10;

FIG. 13 is a cross-sectional view along line B-B in FIG. 12;

FIG. 14 is a perspective view of a thin-film piezoelectric resonator according to a fourth embodiment of the invention;

FIG. 17 is a plan view of a thin-film piezoelectric resonator according to a sixth embodiment of the invention;

FIG. 19 is a plan view of a thin-film piezoelectric resonator according to a modification of that shown in FIG. 18;

FIG. 20 is a plan view of a thin-film piezoelectric resonator in which thickness of a supporting part 5 is smaller than thickness of an annular resonator;

FIG. 21 is a cross-sectional view along line A-A in FIG. 20;

FIG. 22 is a perspective view of a thin-film piezoelectric resonator according to an eighth embodiment of the invention;

FIG. 23 is a cross-sectional view along line C-C in FIG. 22; and

DETAILED DESCRIPTION OF THE INVENTION

Embodiments of the invention will be hereinafter explained with reference to the accompanying drawings.

First Embodiment

Figure 1:
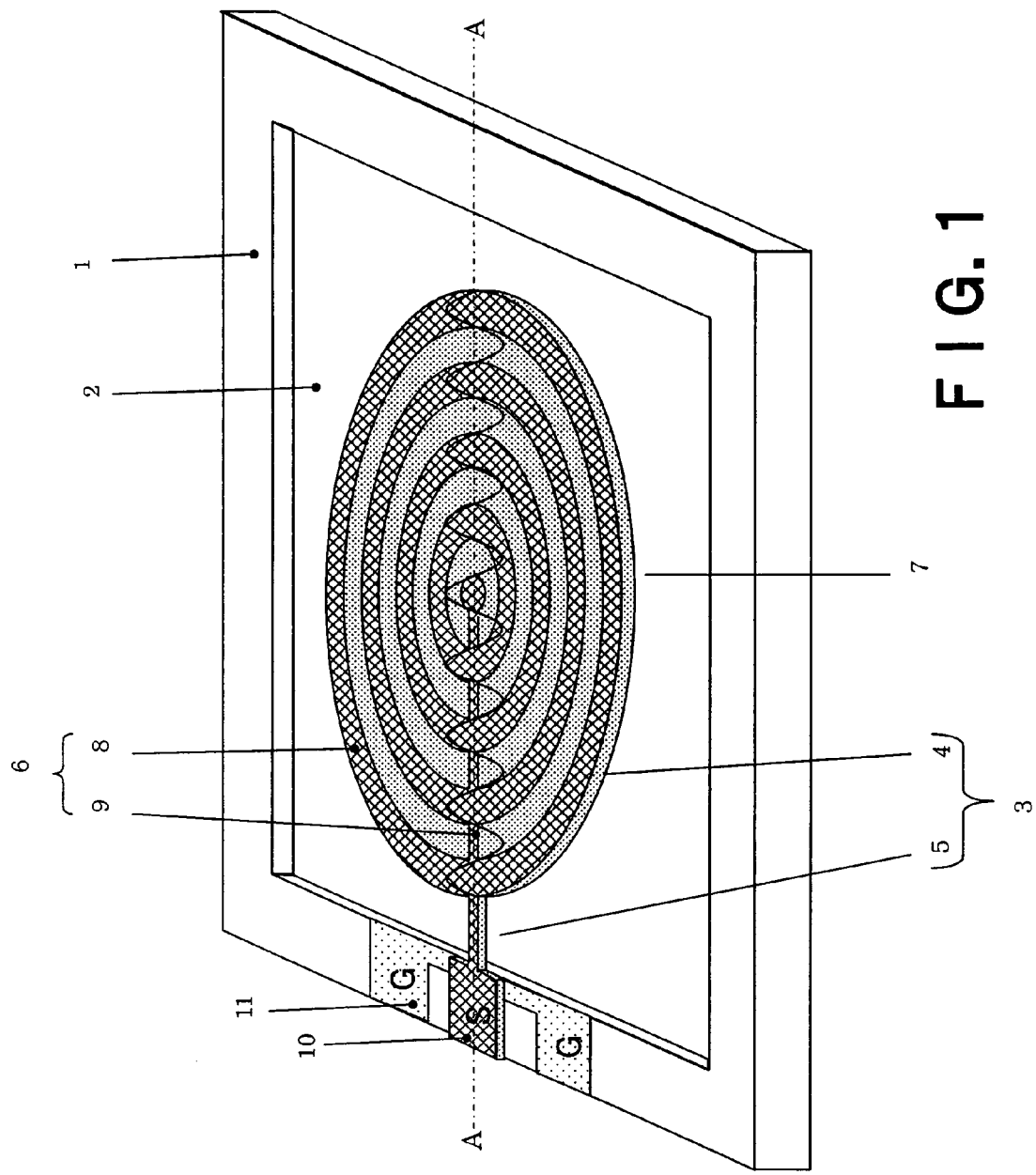
FIG. 1 is a perspective view of a one-port thin-film piezoelectric resonator according to a first embodiment of the invention.

FIG. 1 is a perspective view of a one-port thin-film piezoelectric resonator according to a first embodiment of the invention. FIG. 2 is a cross-sectional view along line A-A in FIG. 1.

As shown in FIG. 1, a rectangular concave part 2 is formed in the center of a substrate 1. A piezoelectric film 3 is formed above the concave part 2. The piezoelectric film 3 has a disc part 4 and a supporting part 5 that extends from the end of the disc part 4 to the end of a substrate 1 around the concave part 2 and supports the disc part 4. The disc part 4 and the supporting part 5 are integrally formed.

An upper electrode 6 is formed above the piezoelectric film 3. A lower electrode 7 is formed under the piezoelectric film 3. The upper electrode 6 has plural annular parts 8 of a concentric shape that have the same width and are arranged at the same intervals, respectively, and a bus bar 9 (a connection part) that connects the annular parts 8 one another. The lower electrode 7 is formed over the entire lower part of the piezoelectric film 3, for example, as shown in FIG. 2. It is preferable that the plural annular parts 8 are formed at the same width. However, the widths of the plural annular parts 8 may fluctuate within some tolerance (e.g., ±0.5%).

The upper electrode 6 is electrically connected to a first pad 10 on the substrate 1. The lower electrode 7 is electrically connected to a second pad 11 on the substrate. A predetermined AC voltage is applied to the first pad 10. The second pad 11 is grounded.

It is preferable that the width of the annular part 8 in the upper electrode 6 and the interval of the annular parts 8 adjacent to each other are the same length. More specifically, this length is set to an integer multiple of a half-wavelength corresponding to a resonant frequency of longitudinal mode oscillation in the width direction of the piezoelectric film 3. Consequently, a total length of the width and the interval of the annular part 8 is an integer multiple of one wavelength. Oscillations in the width direction are combined with one another to cause resonance. It is possible to variably control the resonant frequency by adjusting a diameter of the piezoelectric film 3 and changing the width and the interval of the annular parts 8.

In the thin-film piezoelectric resonator in FIG. 1, when an AC voltage is applied between the first pad 10 and the second pad 11 from a not-shown AC power supply, oscillations of the longitudinal mode occur in the width direction of the annular parts 8 of the upper electrode 6. When an AC voltage including a resonant frequency signal is applied, the oscillations generated in the respective annular parts 8 of the upper electrode 6 intensify one another and the thin-film piezoelectric resonator performs a resonant operation.

The thin-film piezoelectric resonator in FIG. 1 has the following advantages compared with a thin-film piezoelectric resonator that has only one upper electrode of an annular shape.

(1) Since the thin-film piezoelectric resonator in FIG. 1 performs the resonant operation realized by combining plural oscillations, a Q value of the resonance is several times as high as that of the latter thin-film piezoelectric resonator.

(2) Impedance depends on an area of an electrode. Since the upper electrode 6 is constituted by the plural annular parts 8 in the thin-film piezoelectric resonator in FIG. 1, it is possible to increase an electrode area per a unit area. Thus, it is possible to reduce a size of the thin-film piezoelectric resonator.

(3) The resonant frequency depends on the diameter of the piezoelectric film 3, on which the plural annular parts 8 are formed, rather than the width of one annular part 8 of the upper electrode 6. Thus, the resonant frequency is less easily affected by fluctuation in the widths and the intervals of the respective annular parts 8 and accuracy of the resonant frequency is improved. The widths of the respective annular parts 8 of the upper electrode 6 do not need to be extremely small to increase a resonant frequency. It is possible to obtain a resonant frequency in a GHz order or higher resonance frequencies.

The inventor manufactured a thin-film piezoelectric resonator having a diameter of 78 μm, which includes the quintuple annular parts 8 of the upper electrode 6, using an insulating silicon substrate 1 as the substrate 1, using an AlN piezoelectric film 3 having a thickness of 2.5 μm oriented to a "c" axis as the piezoelectric film 3, and using Al electrodes having a thickness of 0.3 μm as the upper electrode 6 and the lower electrode 7.

When the inventor measured resonance characteristics of this thin-film piezoelectric resonator with a network analyzer, extremely sharp resonance characteristics were obtained. As the resonance characteristics, a resonant frequency was 1.18 GHz, a Q value was 3400, a relative difference between a resonant frequency fr and an anti-resonant frequency fa {(fa−fr)/fr} was 0.65%.

As a material of the upper electrode 6 and the lower electrode 7, Cu, Au, Pt, W, Mo, Nb, T, Cr, Ni, Fe, silicide, and the like are conceivable in addition to Al.

In this way, in the first embodiment, the thin-film piezoelectric resonator includes the upper electrode 6 that has the plural annular parts 8 of a concentric shape having the same width and the same intervals. Thus, it is possible to realize the thin-film piezoelectric resonator that can increase the Q value at the time of resonance, reduce the area, improve the accuracy of the resonant frequency, and perform a high-frequency action. Therefore, the resonator according to this embodiment can be used for a voltage controlled oscillator and a filter circuit that operate in a GHz band of a cellular phone or the like.

(Modification of the First Embodiment)

The lower electrode 7 of the thin-film piezoelectric resonator described above does not always have to be formed over the entire lower surface of the piezoelectric film 3 as shown in FIG. 2.

FIG. 3 is a cross-sectional view showing an example in which the lower electrode 7 is patterned in the same shape as the upper electrode 6. In the case of FIG. 3, since a total area of the lower electrode 7 is smaller than that in FIG. 2, impedance of the lower electrode 7 increases and resonance resistance increases by about 25%. On the other hand, a difference between a resonant frequency and an anti-resonant frequency increases by about 15% from that in the case of FIG. 2. Therefore, a band width in which resonance can be generated increases and practical use is improved.

(Application 1 of the First Embodiment)

It is possible to realize various filter circuits by using the plural thin-film piezoelectric resonators in FIG. 1. For example, FIG. 4 is a plan view showing an example of a ladder-type filter constituted by using the thin-film piezoelectric resonator in FIG. 1. FIG. 5 is a circuit diagram of the filter in FIG. 4.

The ladder-type filter in FIG. 5 has a series resonator 15 including three thin-film piezoelectric resonators connected in series and a parallel resonator 16 including two thin-film piezoelectric resonators connected between connection nodes among the three thin-film piezoelectric resonators and a ground terminal.

In the ladder-type filter shown in FIGS. 4 and 5, it is necessary to match a resonant frequency of the series resonator 15 with an anti-resonant frequency of the parallel resonator 16. In this embodiment, the resonant frequency and the anti-resonant frequency were matched by setting a diameter of the piezoelectric films 3 of the two thin-film piezoelectric resonator constituting the parallel resonator 16 larger than a diameter of the three thin-film piezoelectric resonators constituting the series resonator 15 by 0.65%. When characteristics of the ladder-type filter actually manufactured by the inventor were measured, a minimum insertion loss of −3.2 dB and a fractional band width of 1.2% at −5 dB were obtained as the characteristics.

(Application 2 of the First Embodiment)

FIG. 6 is a plan view showing an example of a lattice-type high-frequency filter constituted by using the thin-film piezoelectric resonator in FIG. 1. FIG. 7 is a circuit diagram of the filter in FIG. 6. The lattice-type filter has, as shown in FIG. 7, a first resonator 17 including thin-film piezoelectric resonators connected to first opposite sides opposed to each other, respectively, and a second resonator 18 including thin-film piezoelectric resonators connected to second opposite sides opposed to each other, respectively.

It is necessary to match a resonant frequency of the first resonator 17 with an anti-resonant frequency of the second resonator 18. In this embodiment, the resonant frequency and the anti-resonant frequency were matched by setting a diameter of the piezoelectric films 3 of the second resonator 18 larger than that of the first resonator 17 by 0.65%. When characteristics of the filter manufactured were measured, a minimum insertion loss of −2.5 dB and a fractional band width of 0.8% at −5 dB were obtained as the characteristics.

In this way, it is possible to form various filter circuits such as the ladder-type filter and the lattice-type high-frequency filter by using the thin-film piezoelectric resonator in FIG. 1.

Second Embodiment

Figure 8:
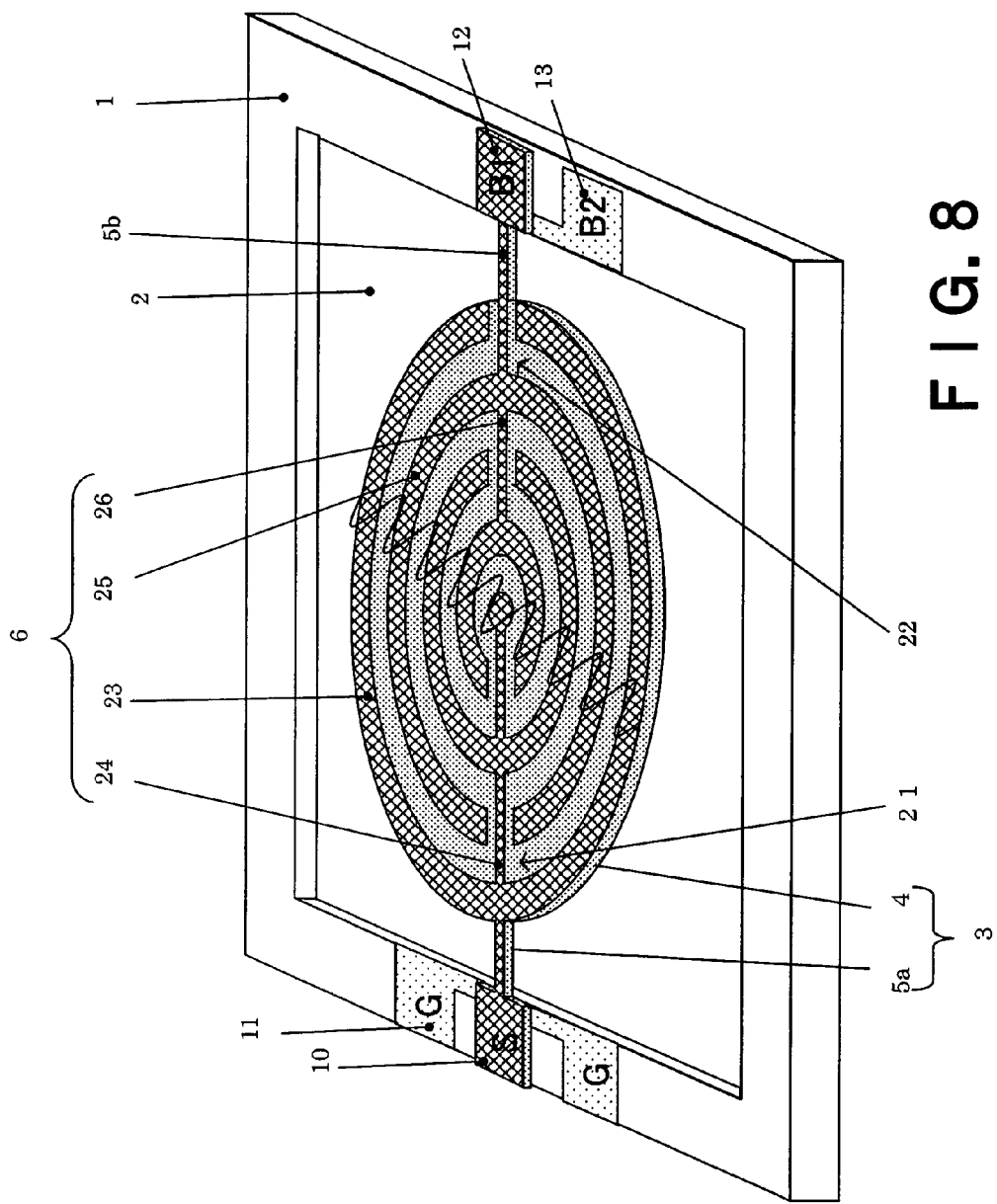
FIG. 8 is a perspective view of a thin-film piezoelectric resonator according to a second embodiment of the invention.

A thin-film piezoelectric resonator according to a second embodiment of the invention is a two-port thin-film piezoelectric resonator. FIG. 8 is a perspective view of the two-port thin-film piezoelectric resonator according to the second embodiment. The thin-film piezoelectric resonator in FIG. 8 includes two resonators (hereinafter referred to as first resonator 21 and a second resonator 22) that are electrically insulated but are elastically combined. The thin-film piezoelectric resonator can perform a function of a filter by itself.

As shown in FIG. 8, the rectangular concave part 2 is formed in the center of the substrate 1. The piezoelectric film 3 is formed above the concave part 2. The piezoelectric film 3 is shared by the first and the second resonators 21 and 22. The piezoelectric film 3 has the disc part 4, a first supporting part 5a and a second supporting part 5b. The first and second supporting parts 5a and 5b extend from two locations at the peripheral edge of the disc part 4 to the end of the substrate 1 around the concave part 2 in opposite directions, respectively, to support the disc part 4. The disc part 4 and the two supporting parts 5a and 5b are integrally formed.

Upper electrodes 6 are formed above the piezoelectric film 3. The lower electrode 7 is formed under the piezoelectric film 3. The upper electrodes 6 are separately provided for the first resonator 21 and the second resonator 22. The upper electrode 6 for the first resonator 21 has plural first annular parts 23 of a concentric shape that have the same width and are arranged at intervals about three times as large as the width and a first bus bar 24 (a connection part) that connects the first annular parts 23 to one another. The upper electrode 6 for the second resonator 22 has plural second annular parts 25 of a concentric shape that have the same width and are arranged at intervals about three times as large as the width and a second bus bar 26 (a connection part) that connects the second annular parts 25 to one another. The first annular parts 23 and the second annular parts 25 are alternately arranged at the same intervals. It is preferable that the width of the first annular parts 23 and the width of the second annular parts 25 are the same. However, the widths of the first annular parts 23 and the second annular parts 25 may fluctuate within some tolerance (e.g., ±0.5%). The lower electrode 7 may be shared by the first and the second resonators 21 and 22 or may be separately provided for each of the resonators.

The first pad 10 connected to the upper electrode 6 for the first resonator 21 and the second pad 11 connected to the lower electrode 7 are formed above the substrate 1 closer to the first supporting part 5a. Similarly, a third pad 12 connected to the upper electrode 6 for the second resonator 22 and a fourth pad 13 connected to the lower electrode 7 are formed above the substrate 1 close to the second supporting part 5b.

A part of the first annular parts 23 is cut. The second bus bar 26 is arranged in this cut portion. Similarly, a part of the second annular parts 25 is cut. The first bus bar 24 is arranged in this cut portion.

The width and the intervals of the plural first annular parts 23 and the width and the intervals of the plural second annular parts 25 are the same length. This length is set to be equal to a half-wavelength of a resonant frequency in width direction longitudinal mode resonance of the piezoelectric film 3.

Consequently, as indicated by a waveform in FIG. 8, resonance formed by combination of oscillations of the first resonator 21 and the second resonator 22 is generated. It is possible to control a resonant frequency in this case by finely adjusting the diameter of the piezoelectric film 3 of a disc shape.

Figure 9:
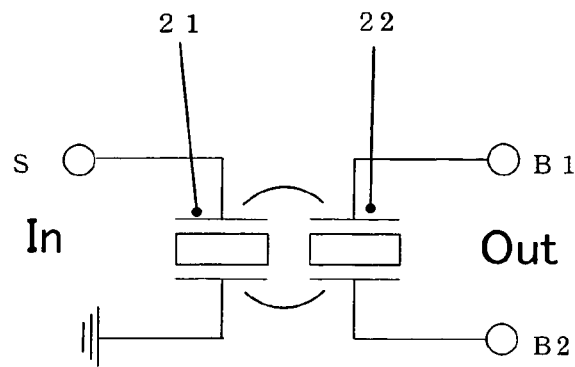
FIG. 9 is an equivalent circuit diagram of the thin-film piezoelectric resonator shown in FIG. 8.

FIG. 9 is an equivalent circuit diagram of the thin-film piezoelectric resonator in FIG. 8. As shown in the FIG. 9, the first resonator 21 and the second resonator 22 are electrically insulated but elastically combined. Oscillations of the first resonator 21 and the second resonator 22 are combined to each other and the resonators perform a resonant operation. It is possible to give a function of a balun to the thin-film piezoelectric resonator by adopting an unbalanced resonator as one of the first resonator 21 and the second resonator 22 and adopting a balanced resonator as the other.

The inventor manufactured a thin-film piezoelectric resonator having a diameter of 78 μm, which has the quintuple annular parts 8 including the first resonator 21 and second resonator 22, using the insulating silicon substrate 1 as the substrate 1, using the AlN piezoelectric film 3 having a thickness of 2.5 μm oriented to a "c" axis as the piezoelectric film 3, and using Al electrodes having a thickness of 0.3 μm as the upper electrodes 6 and the lower electrode 7. When the inventor measured filtering characteristics of this thin-film piezoelectric resonator with a network analyzer, a pass frequency of 1.21 GHz, a minimum insertion loss of −4.6 dB, and a fractional band width of 0.6% at −5 dB were obtained as the characteristics.

In this way, in the second embodiment, the plural first annular parts 23 constituting the first resonator 21 and the plural second annular parts 25 constituting the second resonator 22 are arranged to be opposed to each other on the piezoelectric film 3. Thus, it is possible to manufacture a thin-film piezoelectric resonator that performs an operation of a filter by itself. The first resonator 21 and the second resonator 22 have the upper electrodes 6 including the plural first and second annular parts 23 and 25 having the same width and the same intervals. Thus, it is possible to accurately adjust a resonant frequency by finely adjusting the diameter of the piezoelectric film 3 and set the resonant frequency high.

Third Embodiment

A thin-film piezoelectric resonator according to a third embodiment of the invention is a one-port thin-film piezoelectric resonator of a comb shape.

Figure 10:
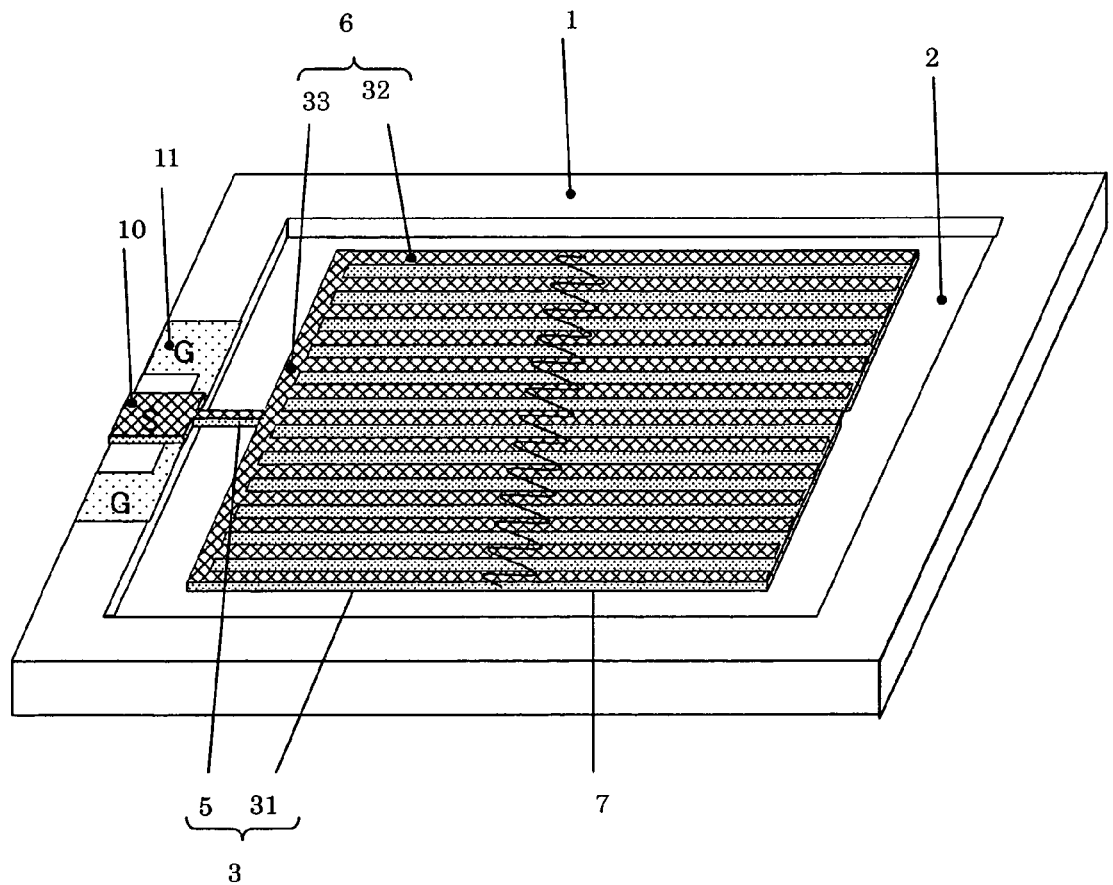
FIG. 10 is a perspective view of a thin-film piezoelectric resonator according to a third embodiment of the invention.

FIG. 10 is a perspective view of the thin-film piezoelectric resonator according to the third embodiment. As shown in FIG. 10, the rectangular concave part 2 is formed in the center of the substrate 1. The piezoelectric film 3 is formed above the concave part 2. The piezoelectric film 3 has a rectangular part 31 and the supporting part 5 that extends from the end of the rectangular part 31 to the end of the substrate 1 around the concave part 2 and supports the rectangular part 31. The rectangular part 31 and the supporting part 5 are integrally formed.

The upper electrodes 6 are formed above the piezoelectric film 3. The lower electrode 7 is formed under the piezoelectric film 3. The upper electrodes 6 are formed in a comb shape and has plural comb parts 32 on the top end side and a bus bar 33 (a connection part) that connects the comb parts 32 to one another. The plural comb parts 32 have the same width, respectively, and are arranged at intervals equal to the width. Length of the widths and the intervals of the respective comb parts 32 is set to an integer multiple of a half-wavelength corresponding to a resonant frequency in a width direction of longitudinal mode resonance of the piezoelectric film 3. Consequently, as indicated by a wavy line in FIG. 10, resonance formed by combination of oscillations, one wavelength of which is obtained by dividing a total length of the width and the interval of the comb part 32 by an integer, is generated. It is possible to control a resonant frequency by finely adjusting the width of the piezoelectric film 3 of a rectangular shape. The lower electrode 7 is formed over, for example, the entire lower part of the piezoelectric film 3. It is preferable that the plural comb parts 32 are formed at the same width. However, the widths of the plural comb parts 32 may fluctuate within some tolerance (e.g., ±0.5%). The upper electrodes 6 are electrically connected to the first pad 10 on the substrate 1. The lower electrode 7 is electrically connected to the second pad 11 on the substrate 1. A predetermined AC voltage is applied to the first pad 10. The second pad 11 is grounded.

The thin-film piezoelectric resonator in FIG. 10 has the following advantages compared with a thin-film piezoelectric resonator that has only one upper electrode 6 of a rectangular shape.

(1) Since the thin-film piezoelectric resonator in FIG. 10 performs the resonant operation realized by combining plural oscillations, a Q value of the resonance is several times as high as that of the latter thin-film piezoelectric resonator.

(2) Impedance depends on an area of an electrode. Since the thin-film piezoelectric resonator in FIG. 10 includes the plural upper electrodes 6, it is possible to increase an electrode area per a unit area. Thus, it is possible to reduce a size of the thin-film piezoelectric resonator.

(3) The resonant frequency depends on the width of the piezoelectric film 3, on which the plural comb parts 32 are formed, rather than the width of one comb part 32 of the upper electrodes 6. Thus, the resonant frequency is less easily affected by fluctuation in the widths and the intervals of the respective comb parts 32 and accuracy of the resonant frequency is improved. The widths of the respective comb parts 32 of the upper electrodes 6 do not need to be extremely small to increase a resonant frequency. It is possible to obtain a resonant frequency in a GHz order or higher resonance frequencies.

The inventor manufactured a thin-film piezoelectric resonator having a width of 152 μm, which includes thirteen comb parts 32 as the upper electrodes 6, using the insulating silicon substrate 1 as the substrate 1, using the AlN piezoelectric film 3 having a thickness of 2.5 μm oriented to a "c" axis as the piezoelectric film 3, and using Al electrodes having a thickness of 0.3 μm as the upper electrodes 6 and the lower electrode 7. When the inventor measured resonance characteristics of this thin-film piezoelectric resonator with a network analyzer, extremely sharp resonance characteristics were obtained. As the resonance characteristics, a resonant frequency was 1.22 GHz, a Q value was 3800, a relative difference between a resonant frequency fr and an anti-resonant frequency fa {(fa−fr)/fr} was 0.62%.

(Modification 1 of the Third Embodiment)

As a modification of the thin-film piezoelectric resonator in FIG. 10, the width on the base end side of the plural comb parts 32 may be reduced.

FIG. 11 is a plan view showing a modification of the thin-film piezoelectric resonator in FIG. 10. In a thin-film piezoelectric resonator in FIG. 11, the widths of base-end side regions 34 of the plural comb parts 32 in the upper electrode 6 are set to a half of the widths in FIG. 10. Consequently, oscillations generated in the comb parts 32 are less easily transmitted to the bus bar 33 side. A loss of oscillations of the comb parts 32 is also reduced.

According to the experiment by the inventor, since the width of the base-end side regions 34 of the comb parts 32 was reduced, impedance of the upper electrodes 6 slightly increased. According to the increase in the impedance, resonance resistance increased by 2%. However, since a loss of a resonant operation decreased, a Q value was improved by 18%.

(Modification 2 of the Third Embodiment)

As a modification of the thin-film piezoelectric resonator in FIG. 10, thickness of piezoelectric elements on the base end side of the plural comb parts 32 may be reduced.

FIG. 12 is a plan view showing another modification of the thin-film piezoelectric resonator in FIG. 10. FIG. 13 is a cross-sectional view along line B-B in FIG. 12. In a thin-film piezoelectric resonator in FIG. 12, the thickness of the piezoelectric elements in base-end side regions 35 of the plural comb parts 32 is smaller than that in other portions by about 20%. Consequently, in the comb parts 32 arranged on the piezoelectric elements, the base-end region 35 is formed in a position lower than a position of the other portions by about 20%.

With such a structure, oscillations in the plural comb parts 32 are less easily transmitted to the bus bar 33 side and a loss of oscillations of the comb parts 32 is reduced.

According to the experiment by the inventor, the thickness of the piezoelectric elements in the base-end side regions 35 of the comb parts 32 was smaller than that of the other portions by about 20%. As a result, a resonant operation in the comb parts 32 was not affected by a loss due to the bus bar and a Q value was improved by about 15%.

Fourth Embodiment

In a thin-film piezoelectric resonator according to a fourth embodiment of the invention, two sets of resonators of a comb shape are arranged to be alternately opposed to each other.

FIG. 14 is a perspective view of the thin-film piezoelectric resonator according to the fourth embodiment. The thin-film piezoelectric resonator in FIG. 14 is a two-port thin-film piezoelectric resonator that includes a first resonator 41 and a second resonator 42 having the same structure as the resonators in FIG. 10 and in which plural comb parts 32a of the first resonator 41 and plural comb parts 32b of the second resonator 42 are arranged to be alternately opposed to each other at the same intervals on the piezoelectric film 3. Otherwise, the thin-film piezoelectric resonator has the same structure as the thin-film piezoelectric resonator according to the third embodiment. Thus, explanations of the same components are omitted.

As in FIG. 9, the first resonator 41 and the second resonator 42 are electrically insulated but elastically combined. The first resonator 41 and the second resonator 42 can perform an operation of a filter by themselves.

The plural comb parts 32a constituting the first resonator 41 have the same width and are arranged at intervals about three times as large as the width. The plural comb parts 32b constituting the second resonator 42 also have the same width and are arranged at intervals about three times as large as the width. The widths of the comb parts 32a and 32b are equal to each other. The widths are set to be a half-wavelength of a resonant frequency in width direction longitudinal mode resonance of the piezoelectric film 3. Consequently, resonance formed by combination of a resonant operation of the first resonator 41 and a resonant operation of the second resonator 42 is generated. A resonant frequency in this case can be controlled by finely adjusting the width of the piezoelectric film 3.

A structure of the pads 10 to 13 in FIG. 14 is the same as the structure of the pads 10 to 13 in FIG. 8. Upper electrodes are separately provided in the first resonator 41 and the second resonator 42, respectively. The pads 10 to 13 corresponding these electrodes are connected to the electrodes. A lower electrode and pads corresponding thereto may be shared by two resonators.

The inventor manufactured a thin-film piezoelectric resonator having a width of 152 μm, which includes thirteen comb parts 32a and 32b as the upper electrodes 6, using the insulating silicon substrate 1 as the substrate 1, using the AlN piezoelectric film 3 having a thickness of 2.5 μm oriented to a "c" axis as the piezoelectric film 3, and using Al electrodes having a thickness of 0.3 μm as the upper electrodes 6 and the lower electrode 7. When the inventor measured resonance characteristics of this thin-film piezoelectric resonator with a network analyzer, a resonant frequency of 1.24 GHz, a maximum insertion loss of −4.3 dB, and a fractional band width at −5 dB of 0.6% were obtained as resonance characteristics.

In this way, in the fourth embodiment, since the two thin-film piezoelectric resonators (the first resonator 41 and the second resonator 42) having the same shape are arranged to be faced to each other, in addition to the characteristics of the third embodiment, it is possible to cause the thin-film piezoelectric resonators to act as a filter by themselves. Since these two resonators are electrically insulated, it is possible to give a function of a balun to the thin-film piezoelectric resonators by adopting an unbalanced resonator as one resonator and adopting a balanced resonator as the other.

The base ends of the comb parts 32a and 32b in FIG. 14 may be reduced in width as shown in FIG. 11 or the thickness of the base parts may be reduced as shown in FIG. 12. Consequently, it is possible to prevent oscillations generated in the comb parts 32a and 32b from being transmitted to the bus bars 33a and 33b and control a loss of the oscillations.

Fifth Embodiment

In a thin-film piezoelectric resonator according to a fifth embodiment of the invention, plural annular resonators having different widths are provided as the upper electrodes 6.

Figure 15:
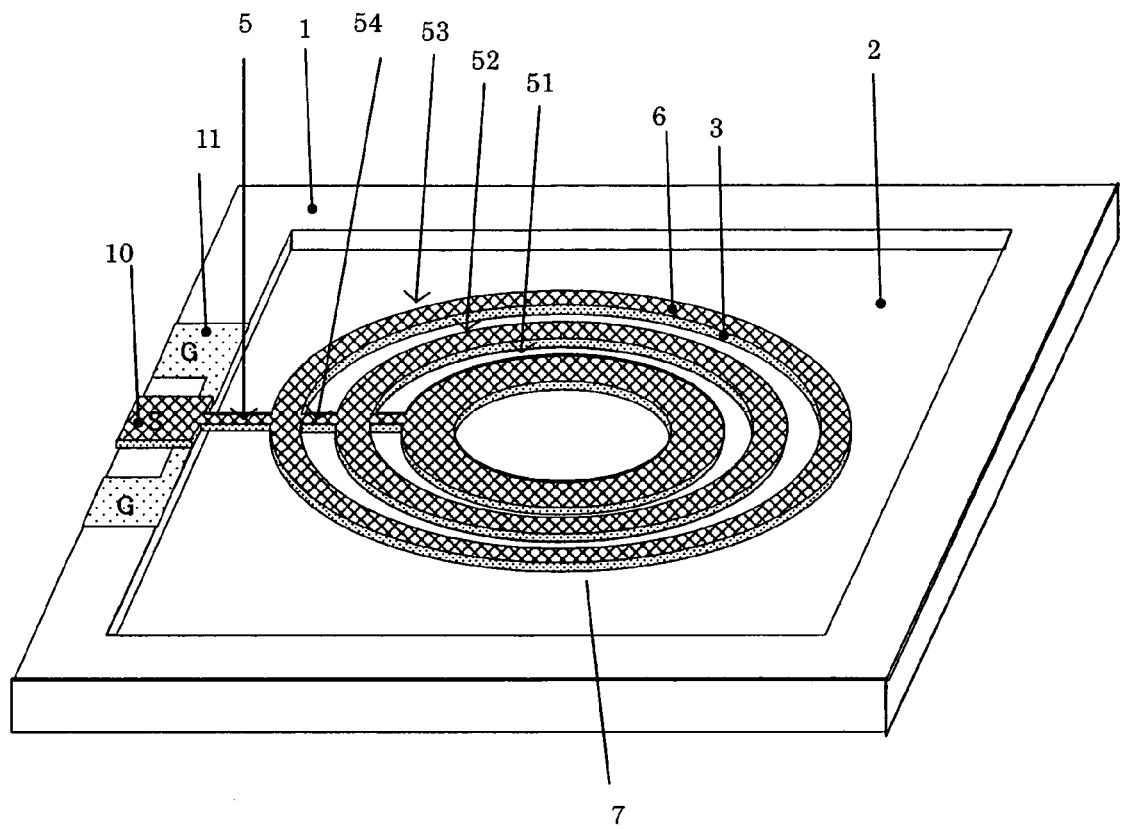
FIG. 15 is a perspective view of a thin-film piezoelectric resonator according to a fifth embodiment of the invention.

FIG. 15 is a perspective view of the thin-film piezoelectric resonator according to the fifth embodiment. As shown in FIG. 15, the rectangular concave part 2 is formed in the center of the substrate 1. Above the concave part 2, plural annular resonators 51, 52, and 53 of a concentric shape having different widths and different diameters, a bus bar 54 (a connection part) that connects these annular resonators to one another, the supporting part 5 that connects the annular resonator 53 on the outermost side and the substrate 1 are formed.

All of the plural annular resonators 51 to 53, the bus bar 54, and the supporting part 5 have the piezoelectric film 3 and the upper electrode 6 and the lower electrode 7 formed above and under the piezoelectric film 3.

The upper electrode 6 is electrically connected to the first pad 10 at the end of the substrate 1. The lower electrode 7 is electrically connected to the second pad 11 at the end of the substrate 1 around the concave part 2.

Each of widths of the plural annular resonators 51 to 53 is set to length of an integer multiple of a half-wavelength of a resonant frequency of longitudinal mode resonance in the width direction. Consequently, the thin-film piezoelectric resonator according to this embodiment can have plural resonance frequencies and can be used in a voltage controlled oscillator and a filter applicable to a multi-band.

The inventor used the insulating silicon substrate 1 as the substrate 1, the AlN piezoelectric film 3 having a thickness of 2.5 μm oriented to a "c" axis as the piezoelectric film 3, and Al electrodes having a thickness of 0.3 μm as the upper electrode 6 and the lower electrode 7. The inventor formed the first annular resonator 51 having a diameter of 55 μm and a width of 25 μm, the second annular resonator 52 having a diameter of 86 μm and a width of 12.4 μm, and the third annular resonator 53 having a diameter of 103 μm and a width of 11.1 μm. When the inventor measured resonance characteristics of this thin-film piezoelectric resonator with a network analyzer, it was found that resonance points were present in three frequencies where a resonant frequency was 0.81 GHz, 1.69 GHz, and 2.02 GHz.

In this way, in the fifth embodiment, since the plural annular resonators having different widths are provided, the thin-film piezoelectric resonator can have plural resonance frequencies and can be used in a voltage controlled oscillator and a filter applicable to a multi-band.

(Modification of the Fifth Embodiment)

It is possible to constitute a balanced voltage controlled oscillator (VCO) by providing plural thin-film piezoelectric resonators in FIG. 15.

Figure 16:
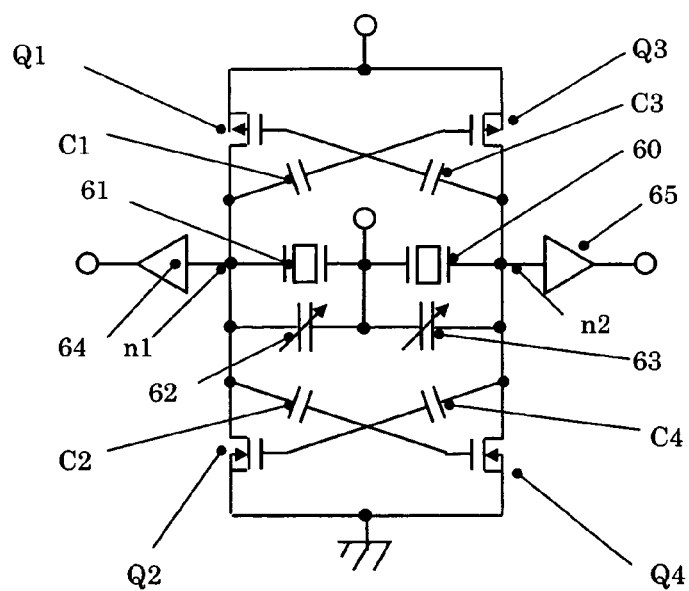
FIG. 16 is a circuit diagram showing an example of a balanced VCO (voltage controlled oscillator) that has two thin-film piezoelectric resonators each shown in FIG. 15.

FIG. 16 is a circuit diagram showing an example of a balanced VCO that has two thin-film piezoelectric resonators each shown in FIG. 15. The balanced VCO in FIG. 16 has two thin-film piezoelectric resonators 60 and 61 connected in series, varicap diodes 62 and 63 connected in parallel to the thin-film piezoelectric resonators 60 and 61, a PMOS transistor Q1 and an NMOS transistor Q2 connected in series between a power supply terminal and a ground terminal, a PMOS transistor Q3 and an NMOS transistor Q4 connected in series between the power supply terminal and the ground terminal, a buffer 64 connected to a connection node n1 of the PMOS transistor Q1 and the NMOS transistor Q2, a buffer 65 connected to a connection node n2 of the PMOS transistor Q3 and the NMOS transistor Q4, a capacitor C1 connected between the node n1 and a gate of the PMOS transistor Q3, a capacitor C2 connected between the node n1 and a gate of the NMOS transistor Q4, a capacitor C3 connected between the node n2 and a gate of the PMOS transistor Q1, and a capacitor C4 connected between the node n2 and a gate of the NMOS transistor Q2. As the varicap diodes, for example, MEMSs (micro electro mechanical systems) driven by piezoelectricity having a capacitance variable ratio of 12 times were used.

When the inventor actually manufactured the balanced VCO in FIG. 16 and measured characteristics, an oscillation characteristic having a variable width of about 30% was obtained near three frequencies where a resonant frequency was 0.81 GHz, 1.69 GHz, and 2.02 GHz. A multi-band VCO with low phase noise could be realized.

Sixth Embodiment

In a thin-film piezoelectric resonator according to a sixth embodiment of the invention, a variable range of a resonant frequency can be expanded only by one annular resonator.

FIG. 17 is a plan view of the thin-film piezoelectric resonator according to the sixth embodiment. As shown in FIG. 17, the rectangular concave part 2 is formed in the center of the substrate 1. An annular resonator 71 is formed above the concave part 2. The width of the resonator 71 is not fixed but continuously changes. The resonator 71 in FIG. 17 includes the upper electrode 6 and the lower electrode 7 with the piezoelectric film 3 held between the electrodes. The widths of all the piezoelectric film 3, the upper electrode 6, and the lower electrode 7 continuously change.

The peripheral edge of the resonator 71 and the substrate 1 are connected by the supporting part 5. The first pad 10 connected to the upper electrode 6 and the second pad 11 connected to the lower electrode 7 are formed above the substrate 1.

The width of the resonator 71 is an integer multiple of a half-wavelength of a resonant frequency of longitudinal mode resonance in the width direction and continuously changes. Thus, a resonant frequency that continuously changes is obtained. Therefore, in this embodiment, it is possible to expand the variable range of the resonant frequency by continuously changing the width of the resonator 71. It is possible to use the thin-film piezoelectric resonator in a voltage controlled oscillator applicable to a wideband.

The inventor manufactured a resonator having a diameter of 130 μm and a width continuously changing from a maximum width of 25 μm to a minimum width of 11.1 μm using the insulating silicon substrate 1 as the substrate 1, the AlN piezoelectric film 3 having a thickness of 2.5 μm oriented to a "c" axis as the piezoelectric film 3, and Al electrodes having a thickness of 0.3 μm as the upper electrode 6 and the lower electrode 7. When the inventor manufactured a VCO in the same manner as the manufacturing of the VCO in FIG. 16 using this resonator and measured resonance characteristics with a network analyzer, a wideband VCO that performed a resonant operation in a wide frequency range from 0.84 GHz to 2.01 GHz could be realized.

Since the thin-film piezoelectric resonator according to the sixth embodiment includes the resonator 71, the width of which continuously changes. Thus, it is possible to expand the variable range of the resonant frequency.

Seventh Embodiment

A thin-film piezoelectric resonator according to a seventh embodiment of the invention controls a loss of oscillation generated in an annular resonator.

Figure 18:
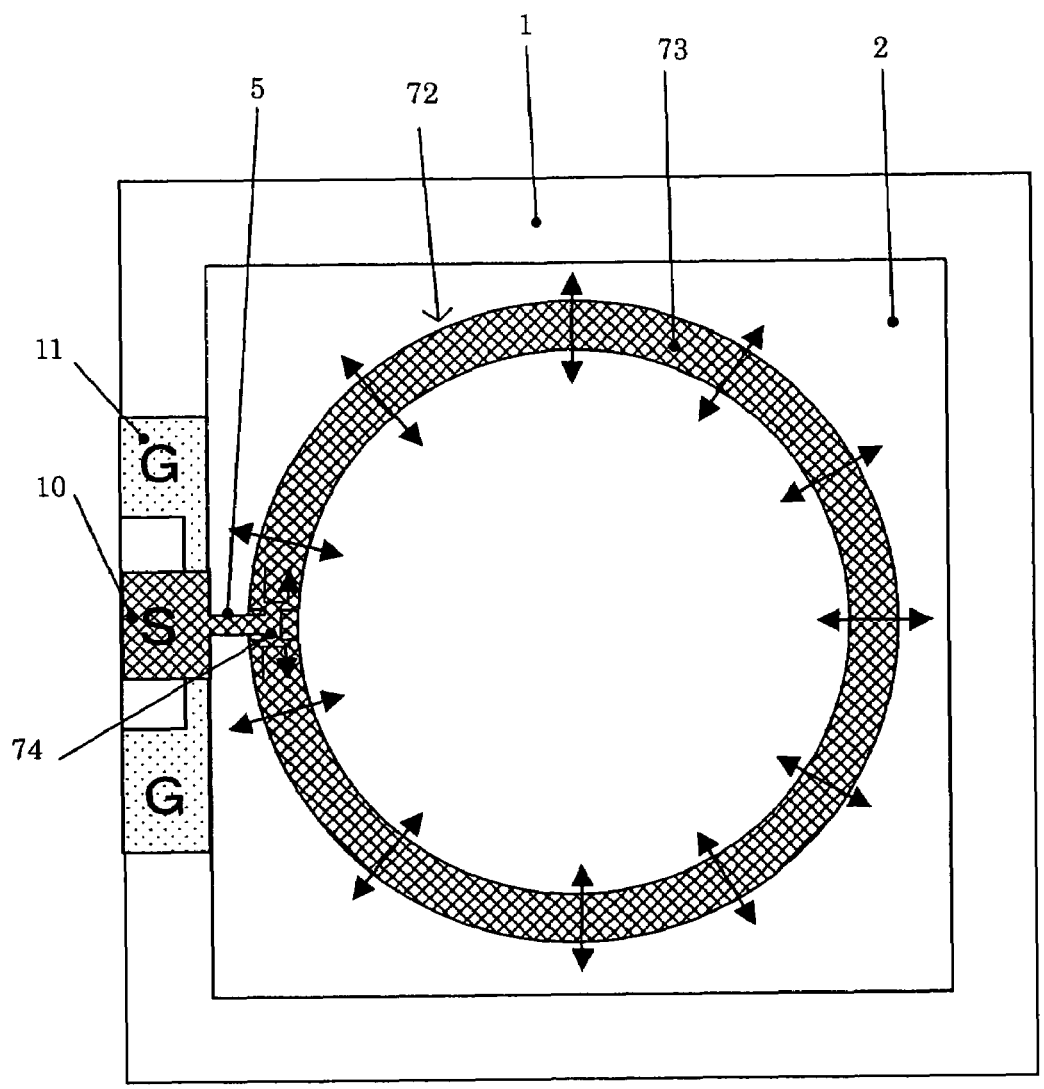
FIG. 18 is a plan view of a thin-film piezoelectric resonator according to a seventh embodiment of the invention.

FIG. 18 is a plan view of the thin-film piezoelectric resonator according to the seventh embodiment. As shown in FIG. 18, the rectangular concave part 2 is formed in the center of the substrate 1. An annular resonator 72 is formed above the concave part 2.

The resonator 72 has an annular part 73 that is partially cut and has a width same as that of the resonator 72 and a neck part 74 that is connected to the cut portion of the annular part 73 and has a width smaller than that of the annular part 73. The supporting part 5 is connected between the neck part 74 and the end of the substrate 1.

Both the resonator 72 and the supporting part 5 have the piezoelectric film 3 and the upper electrode 6 and the lower electrode 7 formed above and under the piezoelectric film 3, respectively.

The upper electrode 6 is electrically connected to the first pad 10 on the substrate 1. The lower electrode 7 is electrically connected to the second pad 11 on the substrate 1.

The width of the neck part 74 is set to about a half of the width of the annular part 73. Oscillation generated in the resonator 72 is less easily transmitted to the supporting part 5 by providing such a neck part 74. A loss of oscillation generated in the resonator 72 does not occur.

When the inventor manufactured the thin-film piezoelectric resonator in FIG. 18 and measured resonance characteristics, it was found that a Q value increased by 22% compared with the thin-film piezoelectric resonator not including the neck part 74.

In this way, in the seventh embodiment, since the narrow neck part 74 is provided in a part of the annular resonator 72 and connected to the supporting part 5, oscillation at the time of resonance of the resonator 72 is less easily transmitted to the supporting part 5 and a loss of oscillation generated in the resonator 72 does not occur. It is possible to manufacture a resonator excellent in resonance characteristics.

(Modification 1 of the Seventh Embodiment)

In the thin-film piezoelectric resonator in FIG. 18, the narrow neck part is provided to reduce a loss of oscillation. However, a thin neck part may be provided.

FIG. 19 is a plan view of a thin-film piezoelectric resonator in a modification of the thin-film piezoelectric resonator in FIG. 18. A neck part 76 thinner than the annular part 73 is provided in a part of an annular resonator 75. The supporting part 5 is connected to the neck part 76. The thickness of the neck part 76 is reduced from the thickness of the annular part 8 by, for example, about 20%. Consequently, oscillation generated in the resonator 75 is less easily transmitted to the supporting part 5 via the neck part 76. It is possible to control a loss of the oscillation generated in the resonator 75.

The inventor measured resonance characteristics of the thin-film piezoelectric resonator in FIG. 19. As a result, it was found that a Q value increased by about 26% compared with the thin-film piezoelectric resonator not including the neck part 76.

(Modification 2 of the Seventh Embodiment)

Besides the thin-film piezoelectric resonators in FIGS. 18 and 19, methods of controlling a loss of oscillation of a resonator are conceivable. FIG. 20 is a plan view of a thin-film piezoelectric resonator in which the thickness of the supporting part 5 is smaller than the thickness of an annular resonator 77. FIG. 21 is a cross-sectional view along line A-A in FIG. 20.

As shown in FIGS. 20 and 21, the thickness of the supporting part 5 is smaller than the thickness of the resonator 77. Consequently, oscillation generated in the resonator 77 is less easily transmitted to the supporting part 5. Therefore, as in the thin-film piezoelectric resonators in FIGS. 18 and 19, it is possible to reduce a loss of oscillation generated in the resonator 77.

Eighth Embodiment

In the first to the seventh embodiments, only oscillation in the width direction is generated. However, oscillation in the thickness direction may be concurrently generated to cause a thin-film piezoelectric resonator to perform a resonant operation.

FIG. 22 is a perspective view of a thin-film piezoelectric resonator according to an eighth embodiment of the invention. As shown in FIG. 22, the rectangular concave part 2 is formed in the center of the substrate 1. An annular resonator 78 is formed above the concave part 2. The width of the resonator 78 is fixed. The resonator 78 is supported on the substrate 1 by the supporting part 5. Both the resonator 78 and the supporting part 5 have the piezoelectric film 3 and the upper electrode 6 and the lower electrode 7 formed above and under the piezoelectric film 3.

The upper electrode 6 is electrically connected to the first pad 10 on the substrate 1. The lower electrode 7 is electrically connected to the second pad 11 on the substrate 1.

FIG. 23 is a cross-sectional view along line C-C in FIG. 22. The width and the thickness of the resonator 78 are adjusted in advance such that the width of the resonator 78 coincides with a half-wavelength of a resonant wave in a width direction longitudinal mode and the thickness of the resonator 78 coincides with a half-wavelength of a resonant wave in a thickness direction longitudinal mode. This makes it possible to expand a range of a resonant frequency.

The inventor manufactured the resonator 78 having a diameter of 120 µm and a width of 11.1 µm using the insulating silicon substrate 1 as the substrate 1, the AlN piezoelectric film 3 having a thickness of 1.5 µm oriented to a "c" axis as the piezoelectric film 3, and Al electrodes having a thickness of 0.3 µm as the upper electrode 6 and the lower electrode 7. When the inventor measured resonance characteristics with a network analyzer using the resonator 78, it was found that extremely sharp resonance characteristics were present. As the resonance characteristics, a resonant frequency was 2.11 GHz and a Q value was 3500.

In this way, in the eighth embodiment, the thin-film piezoelectric resonator is caused to perform resonance in the longitudinal mode in the width direction of the resonator 78 and also perform resonance in the longitudinal mode in the thickness direction. Thus, it is possible to expand a range of a resonant frequency and realize a resonator applicable to a wideband.

Ninth Embodiment

Figure 24:
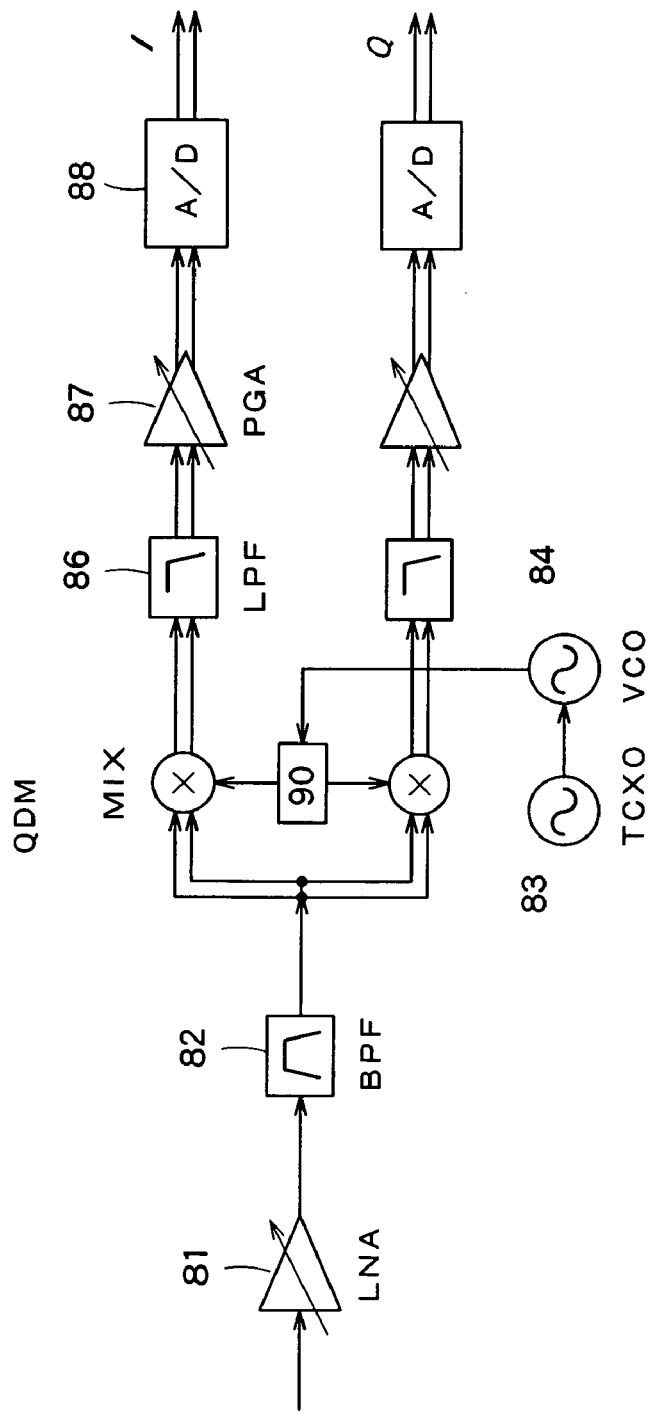
FIG. 24 is a block diagram showing a schematic structure of a reception system of a wireless apparatus including a voltage controlled oscillator that has any one of the thin-film piezoelectric resonators explained in the first to the eighth embodiments.

It is possible to use the thin-film piezoelectric resonator explained in the first to the eighth embodiments as a tank circuit for a voltage controlled oscillator in a wireless apparatus. FIG. 24 is a block diagram showing a schematic structure of a reception system in a wireless apparatus including a voltage controlled oscillator that has any one of the thin-film piezoelectric resonators explained in the first to the eighth embodiments.

The wireless apparatus in FIG. 24 includes a not-shown antenna, a low noise amplifier (LNA) 81 that amplifies a reception signal at the antenna, a band pass filter (BPF) 82 that extracts a signal in a predetermined band from an output signal of the LNA 81, a temperature compensated crystal oscillator (TCXO) 83 that generates a reference oscillation signal, a voltage controlled oscillator (VCO) 84 that generates a reception frequency signal on the basis of the reference oscillation signal of the TCXO 83, a mixer (MIX) 85 that mixes a signal of the BPF 82 and a signal of the VCO 84 and converts the signals into a frequency of a base band, a low pass filter (LPF) 86 that extracts a low frequency component from a signal of the MIX 85, a programmable gain amplifier (PGA) 87 that amplifies a signal of the LPF 86, an A/D converter 88 that subjects a signal of the PGA 87 to A/D conversion, and a demodulator (not shown) that demodulates a signal of the A/D converter 88. The voltage controlled oscillator has the thin-film piezoelectric resonator explained in any one of the embodiments. The BPF 82 also has the thin-film piezoelectric resonator explained in any one of the embodiments.

The wireless apparatus in FIG. 24 performs reception of a so-called direct conversion system for not performing frequency conversion. However, it is also possible to use the thin-film piezoelectric resonator according to the invention in a wireless apparatus of a super heterodyne system.

What is claimed is:

1. A thin-film piezoelectric resonator, comprising:
   a piezoelectric film which is formed via a space on a substrate and is supported on the substrate at only one end portion;
   an upper electrode which has a plurality of electrode layers and a connection part connecting the electrode layers to each other, each of the electrode layers being formed on the piezoelectric film, having the same width and being arranged at the same interval as the width;
   a lower electrode formed under the piezoelectric film;
   a first pad which is formed on he substrate and is electrically connected to the upper electrode; and
   a second pad which is formed on the substrate and is electrically connected to the lower electrode.

2. A thin-film piezoelectric resonator, comprising:
   a piezoelectric film which is formed via a space on a substrate and is supported on the substrate at at least one location:
   an upper electrode which has a plurality of electrode layers and a connection part connecting the electrode layers to each other, each of the electrode layers being formed on the piezoelectric film, having the same width and being arranged at the same interval as the width;
   a lower electrode formed under the piezoelectric film;
   a first pad which is formed on he substrate and is electrically connected to the upper electrode; and
   a second pad which is formed on the substrate and is electrically connected to the lower electrode, wherein the widths of the plurality of electrode layers are integer multiple of a half-wavelength corresponding to a resonant frequency of longitudinal mode resonance in a width direction.

3. A thin-film piezoelectric resonator, comprising:
   a piezoelectric film which is formed via a space on a substrate and is supported on the substrate at at least one location;
   an upper electrode which has a plurality of electrode layers and a connection part connecting the electrode layers to each other, each of the electrode layers being formed on the piezoelectric film, having the same width and being arranged at the same interval as the width;

a lower electrode formed under the piezoelectric film;
a first pad which is formed on he substrate and is electrically connected to the upper electrode; and
a second pad which is formed on the substrate and is electrically connected to the lower electrode, wherein the plurality of electrode layers have a plurality of annular parts in the same concentric shape, the annular parts having the same width and being arranged at the same interval as the width.

4. A thin-film piezoelectric resonator, comprising:
a piezoelectric film which is formed via a space on a substrate and is supported on the substrate at at least one location;
an upper electrode which has a plurality of electrode layers and a connection part connecting the electrode layers to each other, each of the electrode layers being formed on the piezoelectric film, having the same width and being arranged at the same interval as the width;
a lower electrode formed under the piezoelectric film;
a first pad which is formed on he substrate and is electrically connected to the upper electrode; and
a second pad which is formed on the substrate and is electrically connected to the lower electrode, wherein the plurality of electrode layers have a plurality of comb parts which have the same width and are arranged at the same interval as the width, each one end of the comb parts being connected to the connection part.

5. The resonator according to claim 4, wherein widths of base end portions of the comb parts connected to the connection part are formed more narrowly than those of top end portions of the comb parts, and thicknesses of the base end portions are formed more thinly than those of the top end portions.

6. A thin-film piezoelectric resonator, comprising:
first and second resonators formed via a space on a substrate,
wherein the first resonator has:
a piezoelectric film supported on the substrate at at least one location;
a first upper electrode which has a plurality of first electrode layers and a first connection part connecting the first electrode layers to each other, each of the first electrode layers being formed on the piezoelectric film, having the same width and being arranged at an interval of substantially third multiple of the width;
a lower electrode formed under the piezoelectric film;
a first pad which is formed on the substrate and is electrically connected to the first upper electrode; and
a second pad which is formed on the substrate and is electrically connected to the lower electrode,
wherein the second resonator has:
a second upper electrode which a plurality of second electrode layers and a second connection part connecting the second electrode layers to each other, each of the second electrode layers being formed on the piezoelectric film, having the same width, being arranged at an interval of substantially third multiple of the width, and being alternately arranged at the same interval in gaps of the plurality of first electrode layers;
a third pad which is formed on the substrate and is electrically connected to the second upper electrode; and
a fourth pad which is formed on the substrate and is electrically connected to the lower electrode.

7. The resonator according to claim 6, wherein the widths of the plurality of first electrode layers and the widths of the plurality of second electrode layers are integer multiple of a half-wavelength corresponding to a resonant frequency of longitudinal mode resonance in a width direction.

8. The resonator according to claim 6, wherein the plurality of first electrode layers have a plurality of first annular parts of which diameters are different from each other in the same concentric shape, the plurality of first annular part having same width and being arranged at an interval of third multiple of the width;
the plurality of second electrode layers have a plurality of second annular parts of which diameters are different from each other in the same concentric shape, the plurality of second annular part having same width and being arranged at an interval of substantially third multiple of the width;
the first annular part is partially cut along a location where the second connection part is arranged; and
the second annular part is partially cut along a location where the first connection part is arranged.

9. The resonator according to claim 8, wherein the plurality of first electrode layers have a plurality of first comb parts which have the same width and are arranged at an interval of substantially third multiple of the width, each one end of the plurality of first electrode layers being connected to the first connection part; and
the plurality of second electrode layers have a plurality of second comb parts which have the same width and are arranged at an interval of substantially third multiple of the width, each one end of the plurality of second electrode layers being connected to the second connection part.

10. The resonator according to claim 9, wherein widths of base end portions of the first comb parts connected to the first connection part are narrower than top end portions of the first comb parts, or thicknesses of the base end portions are thinner than the top end portions; and
widths of base end portions of the second comb parts connected to the second connection part are narrower than top end portions the second comb parts, or thicknesses of the base end portions are thinner than the top end portions.

11. A thin-film piezoelectric resonator, comprising:
a plurality of annular resonators of concentric shape which are formed via a space on a substrate, have widths different from each other and have diameters different from each other;
a connection part which is formed in a concave part on the substrate and connects the plurality of annular resonators to each other; and
a supporting part which connects the annular resonator arranged the most outside to the substrate,
wherein each of the plurality of annular resonators, the connection part and the supporting part has:
a piezoelectric film;
an upper electrode formed above the piezoelectric film; and
a lower electrode formed under the piezoelectric film.

12. The thin-film piezoelectric resonator according to claim 11, wherein widths of the plurality of annular resonators are integer multiple of a half-wavelength corresponding to resonance frequencies different from each other for longitudinal mode resonance in a width direction.

13. A thin-film piezoelectric resonator, comprising:
an annular resonator which is formed via a space on a substrate, is supported on the substrate at at least one location and has a width to be continuously changed;
wherein the resonator has:
an annular piezoelectric film;

an upper electrode which is formed on the piezoelectric film and is formed along a width of the piezoelectric film;

a lower electrode formed under the piezoelectric film;

a first pad which is formed on the substrate and is connected to the upper electrode; and a second pad which is formed on the substrate and is connected to the lower electrode.

14. A thin-film piezoelectric resonator, comprising:

an annular resonator formed via a space on a substrate;

a supporting part connected between the resonator and the substrate; and first and second pads which are formed on the substrate and supply the resonator with voltages, wherein each of the resonator and the supporting part has:

a piezoelectric film;

an upper electrode formed on the piezoelectric film; and a lower electrode formed on the piezoelectric film, at least one of the resonator and the supporting part having a loss compensation structure which prevents vibration due to resonance generated by the resonator from being transmitted to the supporting part.

15. The resonator according to claim 14, wherein the resonator has:

an annular part having the same width, a portion of the annular part being cut; and a neck part which is connected to a portion cut in the annular part and functions as the loss compensation structure, a width of the neck part being narrower than that of the annular part.

16. The resonator according to claim 14, wherein the resonator has:

an annular part, a portion of which is cut; and a neck part which is connected to a portion cut in the annular part and functions as the loss compensation structure, a thickness of the neck part being thinner than that of the annular part.

17. The resonator according to claim 14, wherein at least a portion of the supporting part has a width thinner than that of the resonator and functions as the loss compensation structure.

18. The resonator according to claim 14, wherein a width of the resonator is an integer multiple of a half-wavelength corresponding to a resonant frequency of longitudinal mode resonance in a width direction.

19. A thin-film piezoelectric resonator, comprising:

an annular resonator formed via a space on a substrate;

a supporting part connected between the resonator and the substrate; and first and second pads which are formed on the substrate and supply the resonator with a voltage, wherein each of the resonator and the supporting part has:

a piezoelectric film;

an upper electrode formed above the piezoelectric film; and a lower electrode formed under the piezoelectric film, a width of the resonator being an integer multiple of a half-wavelength corresponding to a resonant frequency of longitudinal mode resonance in a width direction; and a thickness of the resonator is an integer multiple of a half-wavelength corresponding to the resonant frequency of longitudinal mode resonance in a thickness direction.

20. A filer circuit, comprising:

a series resonator which has a plurality of thin-film piezoelectric resonators connected in series between an input terminal and an output terminal; and a parallel resonator which has at least one thin-film piezoelectric resonator connected between a connection node between the plurality of thin-film piezoelectric resonators and a reference voltage terminal, wherein at least one of the thin-film piezoelectric resonator in the series resonator and the parallel resonator has:

a piezoelectric film which is formed via a space on a substrate and is supported on the substrate at at least one location;

an upper electrode which has a plurality of electrode layers and a connection part connecting the electrode layers to each other, the electrode layers being formed on the piezoelectric film, having the same width and being arranged at the same interval as the width;

a lower electrode formed under the piezoelectric film;

a first pad which is formed on the substrate and is electrically connected to the upper electrode; and a second pad which is formed on the substrate and is electrically connected to the lower electrode.

* * * * *